United States Patent
Ueno et al.

(10) Patent No.: US 9,900,540 B2
(45) Date of Patent: Feb. 20, 2018

(54) SOLID-STATE IMAGING DEVICE AND ELECTRONIC APPARATUS HAVING A PLURALITY OF COMPARATORS AND A PLURALITY OF DIVISION TRANSISTORS

(71) Applicant: Sony Corporation, Tokyo (JP)

(72) Inventors: Yosuke Ueno, Kanagawa (JP); Natsuko Seino, Kanagawa (JP); Kenichi Takamiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/429,915

(22) Filed: Feb. 10, 2017

(65) Prior Publication Data

US 2017/0155864 A1 Jun. 1, 2017

Related U.S. Application Data

(63) Continuation of application No. 15/257,688, filed on Sep. 6, 2016, now Pat. No. 9,602,748, which is a
(Continued)

(30) Foreign Application Priority Data

Jul. 20, 2012 (JP) .................................. 2012-161998

(51) Int. Cl.
*H04N 5/374* (2011.01)
*H04N 5/378* (2011.01)
(Continued)

(52) U.S. Cl.
CPC ....... *H04N 5/378* (2013.01); *H01L 27/14612* (2013.01); *H01L 27/14643* (2013.01); *H04N 5/37455* (2013.01)

(58) Field of Classification Search
CPC .... H04N 5/37455; H04N 5/357; H04N 5/378; H01L 21/822
See application file for complete search history.

(56) References Cited

U.S. PATENT DOCUMENTS

| 7,755,686 B2 * | 7/2010 | Toyama | ............... H04N 5/3742 341/155 |
| 2005/0168605 A1 * | 8/2005 | Hiyama | ................. H04N 3/155 348/301 |

(Continued)

FOREIGN PATENT DOCUMENTS

CN 102334293 1/2012

OTHER PUBLICATIONS

Official Action (with English translation) for Chinese Patent Application No. 201310306078.1 dated Feb. 22, 2017, 15 pages.

*Primary Examiner* — Hung Lam
(74) *Attorney, Agent, or Firm* — Sheridan Ross P.C.

(57) ABSTRACT

There is provided a solid-state imaging device including an imaging unit including a plurality of image sensors, and an analog to digital (AD) conversion unit including a plurality of AD converters arranged in a row direction, each AD converter performing AD conversion of an electrical signal output by the image sensor. Each of the AD converters includes a comparator having a differential pair at an input stage, the differential pair including a first transistor and a second transistor, the first and second transistors are each divided into an equal number of a plurality of division transistors, and an arrangement pattern of the plurality of division transistors constituting the comparator in a predetermined column and an arrangement pattern of the plurality of division transistors constituting the comparator in an adjacent column adjacent to the predetermined column are different from each other.

20 Claims, 20 Drawing Sheets

Related U.S. Application Data continuation of application No. 14/728,792, filed on Jun. 2, 2015, now Pat. No. 9,549,136, which is a continuation of application No. 13/927,885, filed on Jun. 26, 2013, now Pat. No. 9,071,783.

(51) Int. Cl.
*H04N 5/3745* (2011.01)
*H01L 27/146* (2006.01)

(56) References Cited

U.S. PATENT DOCUMENTS

2008/0111905 A1* 5/2008 Toyama ............... H04N 5/3742
  348/308
2011/0254986 A1* 10/2011 Nishimura ............ H01L 27/146
  348/302

\* cited by examiner

SOLID-STATE IMAGING DEVICE AND ELECTRONIC APPARATUS HAVING A PLURALITY OF COMPARATORS AND A PLURALITY OF DIVISION TRANSISTORS

CROSS-REFERENCE TO RELATED APPLICATIONS

This application is a continuation of U.S. patent application Ser. No. 15/257,688, filed Sep. 6, 2016, which is a continuation of U.S. patent application Ser. No. 14/728,792, filed Jun. 2, 2015, now U.S. Pat. No. 9,549,136, which is a continuation of U.S. patent application Ser. No. 13/927,885, filed Jun. 26, 2013, now U.S. Pat. No. 9,071,783, which claims priority to Japanese Patent Application No. 2012-161998, filed in the Japan Patent Office on Jul. 20, 2012, the entire disclosures of which are hereby incorporated herein by reference.

BACKGROUND

The present technology relates to a solid-state imaging device and a manufacturing method, and more particularly, to a solid-state imaging device and a manufacturing method capable of improving a crosstalk characteristic between comparators constituting AD converters in adjacent columns without a side effect, for example, in a solid-state imaging device such as an image sensor including a so-called column parallel type AD conversion unit having a plurality of AD converters arranged in a row direction.

An example of a solid-state imaging device that captures an image includes a CCD (Charge Coupled Device) image sensor or a CMOS (Complementary Metal Oxide Semiconductor) image sensor. In recent years, a CMOS image sensor is attracting attention due to requests for miniaturization or the like.

The CMOS image sensor includes an AD conversion unit that AD (Analog to Digital) converts an analog electrical signal output by a pixel, which performs photoelectric conversion. As the AD conversion unit of the CMOS image sensor, a column parallel type AD conversion unit (hereinafter also referred to as a column parallel AD conversion unit) capable of performing, in parallel, AD conversion on electrical signals output by two or more pixels such as all of a plurality of pixels arranged in one row output is adopted from a request of high-speed processing or the like (Japanese Patent No. 4470700).

The column parallel AD conversion unit is configured, for example, by arranging a plurality of ADCs (AD Converters) the number of which is equal to the number of columns of pixels, side by side in a row direction, and the ADC in each column performs AD conversion of the electrical signal output by the pixel in the column.

An example of the ADC constituting the column parallel AD conversion unit includes a so-called reference signal comparison-type ADC that includes a comparator and a counter and performs AD conversion of an electrical signal output by the pixel by comparing a predetermined reference signal with the electrical signal.

An example of the reference signal comparison type ADC includes a single-slope ADC.

In the single-slope ADC, an electrical signal output by a pixel is AD-converted by a comparator comparing a reference signal whose level is changed at a constant slope, such as a ramp signal, with the electrical signal output by the pixel, and a counter counting a time necessary for a change of the level of the reference signal until the levels of the reference signal and the electrical signal match (Japanese Patent No. 4470700).

SUMMARY

One important performance index of a column parallel AD conversion unit in which a plurality of ADCs are arranged in a row includes a crosstalk characteristic. In the column parallel AD conversion unit, a crosstalk characteristic between comparators constituting the ADCs (between a comparator of an ADC in any column and a comparator of an ADC in a column adjacent to the column) (substantially) governs a crosstalk characteristic of the entire column parallel AD conversion unit.

One factor that deteriorates a crosstalk characteristic between the comparators constituting the ADCs is a parasitic capacitance coupling the two comparators of the ADCs in adjacent columns, which is created between the two comparators.

In a CMOS image sensor, deterioration of the crosstalk characteristic between the comparators constituting the ADCs and thus the crosstalk characteristic of the column parallel AD conversion unit leads to degradation of image quality, such as color mixture, blur of light and shade, or increase in an influence of a defect pixel of an image captured by the CMOS image sensor.

Further, recently, according to a request for reduction of a size of pixels of the CMOS image sensor, a column pitch, i.e., a distance between columns of the adjacent ADCs, tends to be further decreased (shorter).

Further, in a stack type image sensor in which mounting is performed to stack a pixel chip that is a bare chip including pixels on the upper side and a circuit chip that is a bare chip including circuits other than the pixels, including a column parallel AD conversion unit, on the lower side, it is necessary to form the circuit chip to have (substantially) the same size as the pixel chip for miniaturization.

In this case, since it is necessary for various circuits as well as the column parallel AD conversion unit to be formed in the circuit chip, it is necessary for the column pitch of the ADCs of the column parallel AD conversion unit to be smaller than the column pitch of the pixel.

Further, when the column pitch of the ADC is smaller, a distance between two comparators of the ADCs in adjacent columns becomes smaller. As a result, the parasitic capacitance between the two comparators of the ADCs in the adjacent columns increases and the crosstalk characteristic also deteriorates.

An example of a method of improving the crosstalk characteristic of the column parallel AD conversion unit includes a method of providing a strong shield between ADCs in adjacent columns or a method of increasing a distance between comparators (of ADCs) in adjacent columns by physically forming transistors constituting the comparator of the ADC in each column to be elongated in a column direction.

However, in the method of providing the shield between ADCs in the adjacent columns, a side effect occurs in that an area of the column parallel AD conversion unit increases as much as the shield is provided.

Further, in the method of forming the transistors constituting the comparator to be elongated, since a proportion of an interface increases, a parasitic capacitance relative to ground increases. Accordingly, a side effect occurs in that a noise characteristic is degraded or a noise called a process-caused noise such as RTS (Random Telegraph Signal) noise increases.

This technology has been made in view of such circumstances and is intended to improve a crosstalk characteristic without a side effect.

According to an embodiment of the present technology, there is provided a solid-state imaging device including an imaging unit including a plurality of image sensors, and an analog to digital (AD) conversion unit including a plurality of AD converters arranged in a row direction, each AD converter performing AD conversion of an electrical signal output by the image sensor. Each of the AD converters includes a comparator having a differential pair at an input stage, the differential pair including a first transistor and a second transistor, the first and second transistors are each divided into an equal number of a plurality of division transistors, and an arrangement pattern of the plurality of division transistors constituting the comparator in a predetermined column and an arrangement pattern of the plurality of division transistors constituting the comparator in an adjacent column adjacent to the predetermined column are different from each other.

In the solid-state imaging device as described above, the AD conversion unit having a plurality of AD converters arranged in a row direction includes a comparator having a differential pair at an input stage, the differential pair including a first transistor and a second transistor, and the first and second transistors are divided into the same number of a plurality of division transistors. The arrangement pattern of the plurality of division transistors constituting the comparator in a predetermined column and the arrangement pattern of the plurality of division transistors constituting the comparator in an adjacent column adjacent to the predetermined column are different from each other.

According to an embodiment of the present technology, there is provided a method of manufacturing a solid-state imaging device including an imaging unit including a plurality of image sensors, and an analog to digital (AD) conversion unit including a plurality of AD converters arranged in a row direction, each AD converter performing AD conversion of an electrical signal output by the image sensor, the method including, in each of the AD converters, a comparator having a differential pair at an input stage, the differential pair including a first transistor and a second transistor, dividing the first and second transistors each into an equal number of a plurality of division transistors, and arranging the plurality of division transistors constituting the comparator in a predetermined column and the plurality of division transistors constituting the comparator in an adjacent column adjacent to the predetermined column in different arrangement patterns.

In the manufacturing method as described above, the plurality of division transistors constituting the comparator in a predetermined column and the plurality of division transistors constituting the comparator in an adjacent column adjacent to the predetermined column are arranged in a different arrangement pattern.

Further, the solid-state imaging device may be an independent device or may be an internal block constituting one device.

According to an embodiment of the present technology, it is possible to improve a crosstalk characteristic. Particularly, in the solid-state imaging device including the AD conversion unit having a plurality of AD converters arranged in a row direction, it is possible to improve a crosstalk characteristic between the comparators constituting the AD converters in the adjacent columns without a side effect.

DETAILED DESCRIPTION OF THE EMBODIMENT(S)

Figure 1:
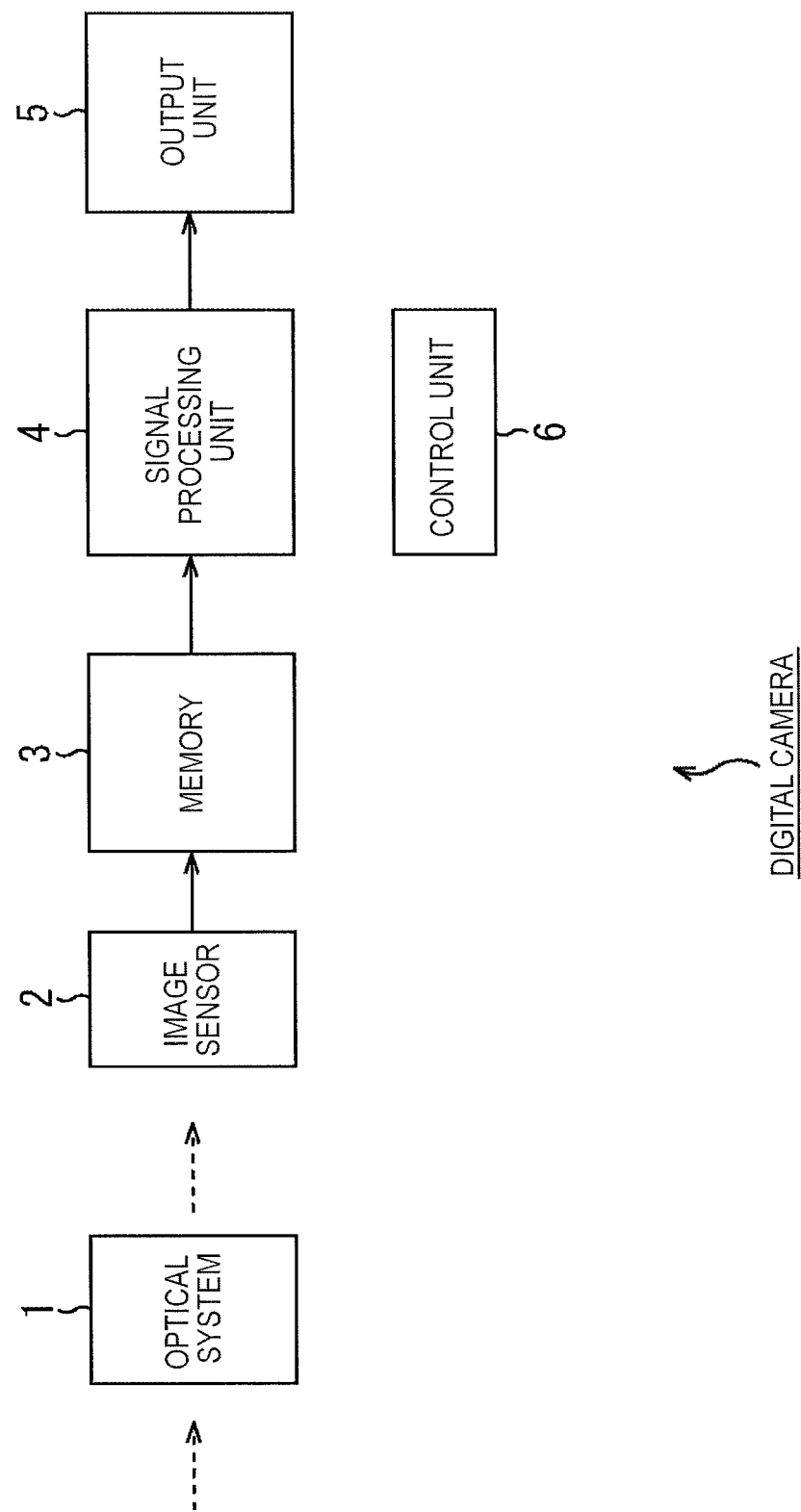
FIG. 1 is a block diagram illustrating a configuration example of an embodiment of a digital camera to which the present technology has been applied.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

[Embodiment of a Digital Camera to Which the Present Technology has been Applied]

FIG. 1 is a block diagram illustrating a configuration example of an embodiment of a digital camera to which the present technology has been applied.

Further, the digital camera can capture either a still image or a moving image.

In FIG. 1, the digital camera includes an optical system 1, an image sensor 2, a memory 3, a signal processing unit 4, an output unit 5, and a control unit 6.

For example, the optical system 1 includes a zoom lens, a focus lens, an iris and the like, which are not illustrated, and causes light from the outside to be incident on the image sensor 2.

The image sensor 2 is, for example, a CMOS image sensor, and receives incident light from the optical system 1, performs photoelectric conversion, and outputs image data corresponding to the incident light from the optical system 1.

The memory 3 temporarily stores the image data output by the image sensor 2.

The signal processing unit 4 performs, for example, a process such as removal of noise or adjustment of white balance as signal processing using the image data stored in the memory 3, and supplies resultant image data to the output unit 5.

The output unit 5 outputs the image data from the signal processing unit 4.

In other words, the output unit 5 includes, for example, a display (not illustrated) including liquid crystal or the like, and displays an image corresponding to the image data from the signal processing unit 4 as a so-called through image.

Further, the output unit 5 includes, for example, a driver (not illustrated) that drives a recording medium such as a semiconductor memory, a magnetic disk, or an optical disc, and records the image data from the signal processing unit 4 in the recording medium.

The control unit 6 controls each block constituting the digital camera according to a manipulation of a user or the like.

In the digital camera configured as described above, the image sensor 2 receives the incident light from the optical system 1 and outputs the image data according to the incident light.

The image data output by the image sensor 2 is supplied to and stored in the memory 3.

The signal processing unit 4 performs signal processing of the image data stored in the memory 3, and supplies the image data to the output unit 5.

In the output unit 5, the image data from the signal processing unit 4 is output.

[Configuration Example of Image Sensor 2]

Figure 2:
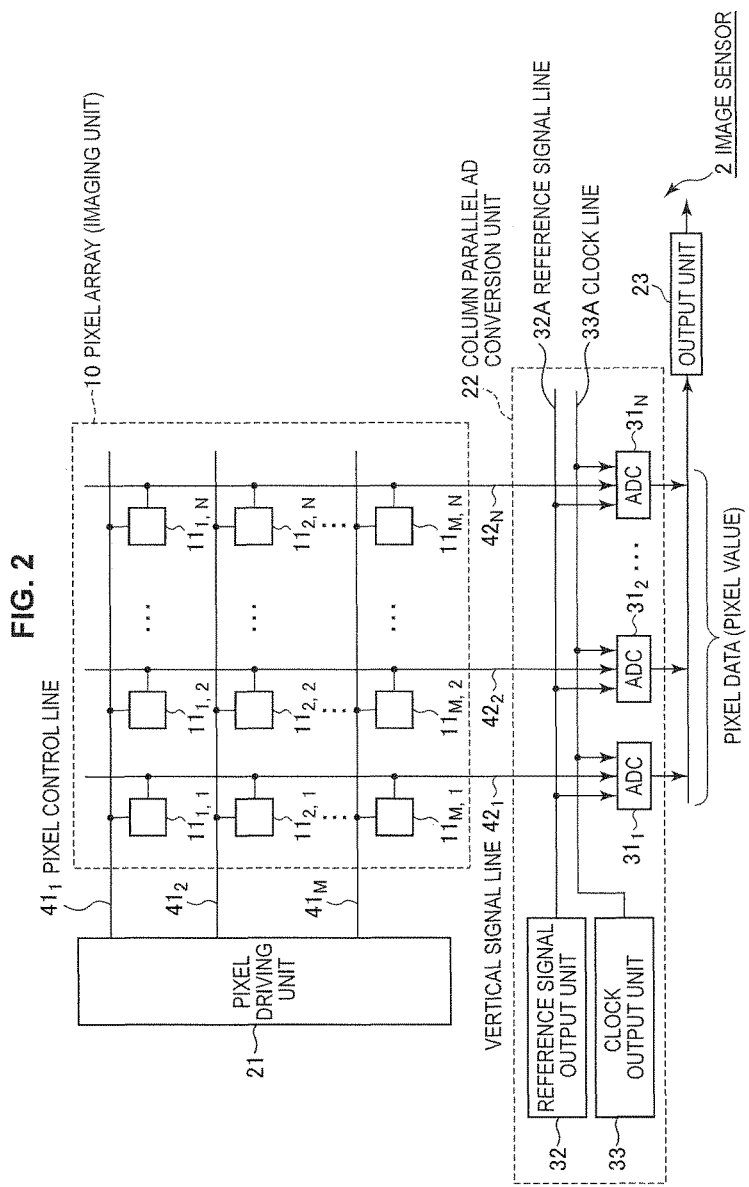
FIG. 2 is a block diagram illustrating a configuration example of an image sensor 2.

FIG. 2 is a block diagram illustrating a configuration example of the image sensor 2 of FIG. 1.

In FIG. 2, the image sensor 2 includes a pixel array 10, a pixel driving unit 21, a column parallel AD conversion unit 22, and an output unit 23.

The pixel array 10 is an imaging unit including M×N (M and N are integers equal to or more than 1) pixels $11_{1,1}$, $11_{1,2}, \ldots, 11_{1,N}, 11_{2,1}, 11_{2,2}, \ldots, 11_{2,N}, \ldots, 11_{M,1}, 11_{M,2}, \ldots, 11_{M,N}$ as image sensors that perform capturing.

The M×N pixels $11_{1,1}$ to $11_{M,N}$ are arranged in a matrix (lattice) of M rows and N columns on a two-dimensional plane.

Here, in the present embodiment, the number N of columns is plural, and therefore, at least a plurality (N) of pixels $11_{m,1}, 11_{m,2}, \ldots, 11_{m,N}$ are arranged in a row direction in the pixel array 10.

A pixel control line $41m$ extending in the row direction (horizontal direction) is connected to the N pixels $11_{m,1}$ to $11_{m,N}$ arranged in the row direction of the $m^{th}$ row (m=1, 2, ..., M) (from the top) in the pixel array 10.

Further, a vertical signal line $42_n$ extending in the column direction (vertical direction) is connected to M pixels $11_{1,n}$ to $11_{M,n}$ arranged in the column direction of the $n^{th}$ column (n=1, 2, ..., N) (from the left).

The pixel $11_{m,n}$ performs photoelectric conversion of light incident on the pixel $11_{m,n}$ (incident light). Furthermore, the pixel $11_{m,n}$ outputs a voltage (an electrical signal) corresponding to electric charges obtained through the photoelectric conversion onto the vertical signal line $42_n$ according to control from the pixel driving unit 21 via the pixel control line $41_m$.

Further, the pixel $11_{m,n}$ may perform, for example, photoelectric conversion of a predetermined color of light that is incident via a color filter (not illustrated) of a Bayer array or the like.

The pixel driving unit 21, for example, controls (drives) the pixels $11_{m,1}$ to $11_{m,N}$ connected to the pixel control line $41_m$, via the pixel control line $41_m$ according to control of the control unit 6 (FIG. 1) or the like.

The column parallel AD conversion unit 22 is connected with the pixels $11_{m,1}$ to $11_{m,N}$ arranged in one row via the vertical signal lines $42_1$ to $42_N$. Therefore, the voltage (the electrical signal) output by the pixel $11_{m,n}$ is supplied to the column parallel AD conversion unit 22 via the vertical signal line $42_n$.

The column parallel AD conversion unit 22 performs, in parallel, AD conversion of the voltages (electrical signals) supplied from the pixels $11_{m,1}$ to $11_{m,N}$ arranged in one row via the vertical signal lines $42_1$ to $42_N$, and supplies resultant digital data to the output unit 23 as pixel values (pixel data) of the pixels $11_{m,1}$ to $11_{m,N}$.

Here, the column parallel AD conversion unit 22 may perform, in parallel, the AD conversion of all the electrical signals of N pixels $11_{m,1}$ to $11_{m,N}$ arranged in one row, as well as perform, in parallel, AD conversion of the electrical signals of a plurality of pixels the number of which is less than N among the N pixels $11_{m,1}$ to $11_{m,N}$.

However, hereinafter, the column parallel AD conversion unit 22 is assumed to perform, in parallel, the AD conversion of the electrical signals of all of N pixels $11_{m,1}$ to $11_{m,N}$ arranged in one row in order to simplify the description.

The column parallel AD conversion unit 22 includes a number N of ADCs (Analog to Digital Converters) $31_1$ to $31_N$ to perform, in parallel, the AD conversion of the electrical signals of all the N pixels $11_{m,1}$ to $11_{m,N}$ arranged in one row.

Further, the column parallel AD conversion unit 22 includes a reference signal output unit 32 and a clock output unit 33.

The reference signal output unit 32 supplies (outputs), for example, a reference signal whose level is changed from a predetermined initial value to a predetermined final value at a constant slope, such as a ramp signal, to the ADCs $31_1$ to $31_N$ via a reference signal line 32A.

The clock output unit 33 supplies (outputs) a clock at a predetermined frequency to the ADCs $31_1$ to $31_N$ via a clock line 33A.

The ADC $31_n$ is connected to the vertical signal line $41_n$, and therefore an electrical signal of the pixel $11_{m,n}$ (the electrical signal output by the pixel $11_{m,n}$) is supplied to the ADC $31_n$ via the vertical signal line $41_n$.

The ADC $31_n$ performs CDS (Correlated Double Sampling) and AD conversion of the electrical signal supplied from the pixel $11_{m,n}$ via the vertical signal line $41_n$ using the reference signal from the reference signal output unit 32 and the clock from the clock output unit 33.

In other words, the ADC $31_n$ performs the AD conversion and the CDS of the electrical signal from the pixel $11_{m,n}$ by comparing the electrical signal from the pixel $11_{m,n}$ with the reference signal from the reference signal output unit 32 and counting a time necessary for a level of the reference signal to be changed until levels of the electrical signal from the pixel $11_{m,n}$ and the reference signal match.

Here, in the ADC $31_n$, the count of the time necessary for the level of the reference signal to be changed until the levels of the electrical signal from the pixel $11_{m,n}$ and the reference signal match is performed by counting the clock from the clock output unit 33.

The ADC $31_n$ supplies digital data that can be obtained as a result of the AD conversion and the CDS to the output unit 23 as a pixel value (pixel data) of the pixel $11_{m,n}$.

Further, the electrical signals of the N pixels $11_{m,1}$ to $11_{m,N}$ of each of the first row to the $M^{th}$ row of the pixel array 10 are supplied to the N ADCs $31_1$ to $31_N$, for example, sequentially from the first row, and the AD conversion and the CDS of the electrical signals are performed, so to speak, in unit of rows.

The output unit 23 temporarily stores the pixel data of the pixels $11_{m,1}$ to $11_{m,N}$ from the ADCs $31_1$ to $31_N$, and outputs the pixel data as image data of the $m^{th}$ row to the outside (in the present embodiment, the memory 3 (FIG. 1)).

Further, while the CDS as well as the AD conversion is assumed to be performed in the ADC $31_n$ herein, only the AD conversion may be performed in the ADC $31_n$ and the CDS may be performed in the output unit 23.

[Configuration Example of Pixel $11_{m,n}$]

Figure 3:
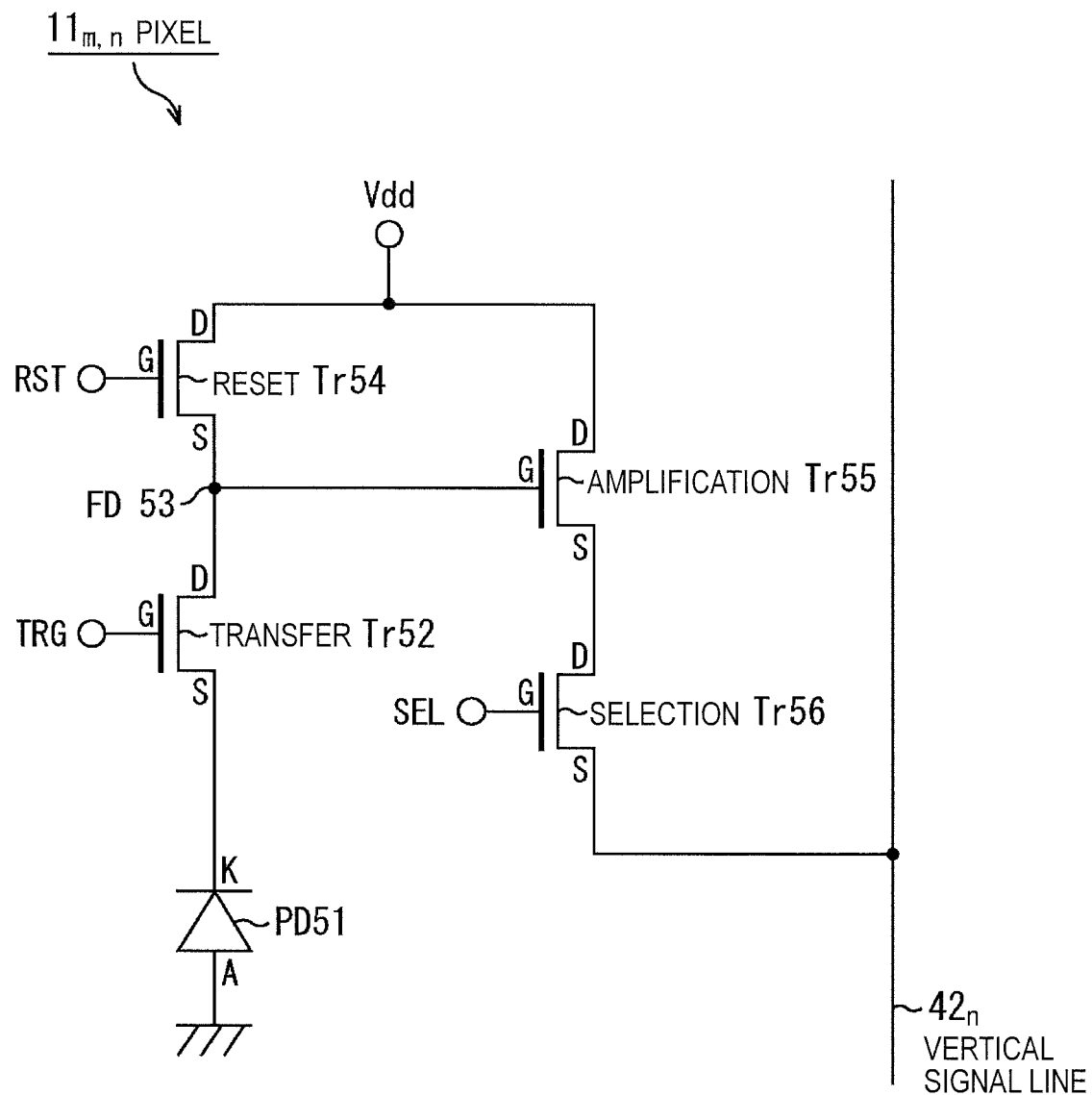
FIG. 3 is a circuit diagram illustrating a configuration example of a pixel $11_{m,n}$.

FIG. 3 is a circuit diagram illustrating a configuration example of the pixel $11_{m,n}$ of FIG. 2.

In FIG. 3, the pixel $11_{m,n}$ includes a PD (Photodiode) 51 and four nMOS (negative channel MOS) FETs (Field Effect Transistors) 52, 54, 55 and 56.

Further, in the pixel $11_{m,n}$, a drain of the FET 52, a source of the FET 54 and a gate of the FET 55 are connected, and a FD (Floating Diffusion) (capacitance) 53 for converting electric charges to a voltage is formed at a point of the connection.

The PD 51 is an example of the photoelectric conversion element as the image sensor, and receives incident light and accumulates the electric charges corresponding to the incident light to perform the photoelectric conversion.

An anode of the PD 51 is connected to the ground (is grounded), and a cathode of the PD 51 is connected to a source of the FET.

The FET 52 is an FET for transferring electric charges accumulated in the PD 51 from the PD 51 to the FD 53, and is hereinafter referred to as a transfer Tr 52.

The source of the transfer Tr 52 is connected to a cathode of the PD 51, and the drain of the transfer Tr 52 is connected to the source of the FET 54 via the FD 53.

Further, a gate of the transfer Tr 52 is connected to the pixel control line $41_m$, and a transfer pulse TRG is supplied to the gate of the transfer Tr 52 via the pixel control line $41_m$.

Here, since the pixel driving unit 21 (FIG. 2) drives (controls) the pixel $11_{m,n}$ via the pixel control line $41_m$, a control signal flowing in the pixel control line $41_m$ includes a reset pulse RST and a selection pulse SEL, which will be described below, as well as the transfer pulse TRG.

The FD 53 is an area that converts electric charges to a voltage, like a capacitor formed at the connection point of the drain of the transfer Tr 52, the source of the FET 54 and the gate of the FET 55.

The FET 54 is an FET for resetting the electric charges (voltage; electric potential) accumulated in the FD 53, and is hereinafter referred to as a reset Tr 54.

A drain of the reset Tr 54 is connected to a power supply Vdd.

Further, the gate of the reset Tr 54 is connected to the pixel control line $41_m$, and the reset pulse RST is supplied to the gate of the reset Tr 54 via the pixel control line $41_m$.

The FET 55 is an FET for amplifying the voltage of the FD 53, and is hereinafter referred to as an amplification Tr 55.

The gate of the amplification Tr 55 is connected to the FD 53, and a drain of the amplification Tr 55 is connected to the power supply Vdd. Further, a source of the amplification Tr 55 is connected to a drain of the FET 56.

The FET 56 is an FET for selecting the output of the electrical signal (the voltage) to the vertical signal line $42_n$, and is hereinafter referred to as a selection Tr 56.

A source of the selection Tr 56 is connected to the vertical signal line $42_n$.

Further, the gate of the selection Tr 56 is connected to the pixel control line $41_m$, and the selection pulse SEL is supplied to the gate of the selection Tr 56 via the pixel control line $41_m$.

Here, the pixel $11_{m,n}$ may be configured without the selection Tr 56.

Further, a configuration of a shared pixel in which a plurality of PDs 51 and transfer Trs 52 share the FD 53 to the selection Tr 56 may be adopted as a configuration of the pixel $11_{m,n}$.

In the pixel $11_{m,n}$ configured as above, the PD 51 starts accumulation of the electric charges according to an amount of incident light by receiving the incident light and performing the photoelectric conversion.

When a predetermined time (exposure time) has elapsed after the accumulation of the electric charges in the PD 51 has started, the pixel driving unit 21 (FIG. 2) temporarily sets the transfer pulse TRG to an H (High) level (from an L (Low) level).

As the transfer pulse TRG is temporarily at the H level, the Transfer Tr 52 is temporarily in an ON state.

When the transfer Tr 52 enters the ON state, the electric charges accumulated in the PD 51 are transferred to the FD 53 via the transfer Tr 52 and accumulated.

Here, before temporarily setting the transfer pulse TRG to the H level, the pixel driving unit 21 temporarily sets the reset pulse RST to the H level to thereby temporarily set the reset Tr 54 to an ON state.

As the reset Tr 54 is in the ON state, the electric charges in the FD 53 are swept out to the power supply Vdd via the reset Tr 54 and reset.

After the electric charges of the FD 53 are reset, the pixel driving unit 21 temporarily sets the transfer pulse TRG to the H level to thereby temporarily set the transfer Tr 52 to an ON state, as described above.

As the transfer Tr 52 enters the ON state, the electric charges accumulated in the PD 51 are transferred to the reset FD 53 via the transfer Tr 52 and accumulated.

Meanwhile, the amplification Tr 55 outputs, to its source, the voltage (electric potential) corresponding to the electric charges in the FD 53 connected to the gate.

As described above, the source of the amplification Tr 55 is connected to the drain of the selection Tr 56. When the selection Tr 56 enters an ON state, the selection Tr 56 outputs the voltage output (appearing) in the source of the amplification Tr 55 to the vertical signal line $42_n$ connected to the source of the selection Tr 56 to be supplied to the ADC $31_n$ (FIG. 2) connected to the vertical signal line $42_n$.

The pixel driving unit 21 temporarily sets the selection pulse SEL to the H level at a timing immediately after the FD 53 (electric charges in the FD 53) is reset as the reset Tr 54 enters the ON state and a timing after the electric charges accumulated in the PD 51 are transferred to and accumulated in the reset FD 53 via the transfer Tr 52 as the transfer Tr 52 enters the ON state.

As the selection pulse SEL is temporarily at an H level at the timing immediately after the FD 53 is reset, the selection Tr 56 enters the ON state, and the voltage of the reset FD 53 (hereinafter referred to as a reset level) is supplied to the ADC $31_n$ connected to the vertical signal line $42_n$ via the amplification Tr 55, and the selection Tr 56 that is in an ON state.

Further, as the selection pulse SEL is temporarily at an H level at a timing after the electric charges accumulated in the PD 51 are transferred to and accumulated in the reset FD 53, the selection Tr 56 enters the ON state, and the voltage of the FD 53 after the electric charges have been transferred from the PD 51, i.e., a voltage (referred to as a signal level) corresponding to the pixel data (a pixel value) relative to the reset level is supplied to the ADC $31_n$ connected to the vertical signal line $42_n$ via the amplification Tr 55, and the selection Tr 56 that is in the ON state.

In the ADC $31_n$, AD conversion of the signal level and the reset level, and CDS of subtracting the reset level from the signal level and extracting the voltage (electrical signal) corresponding to the electric charges accumulated in the PD 51 as the pixel data are performed.

[Configuration Example of ADC $31_n$]

Figure 4:
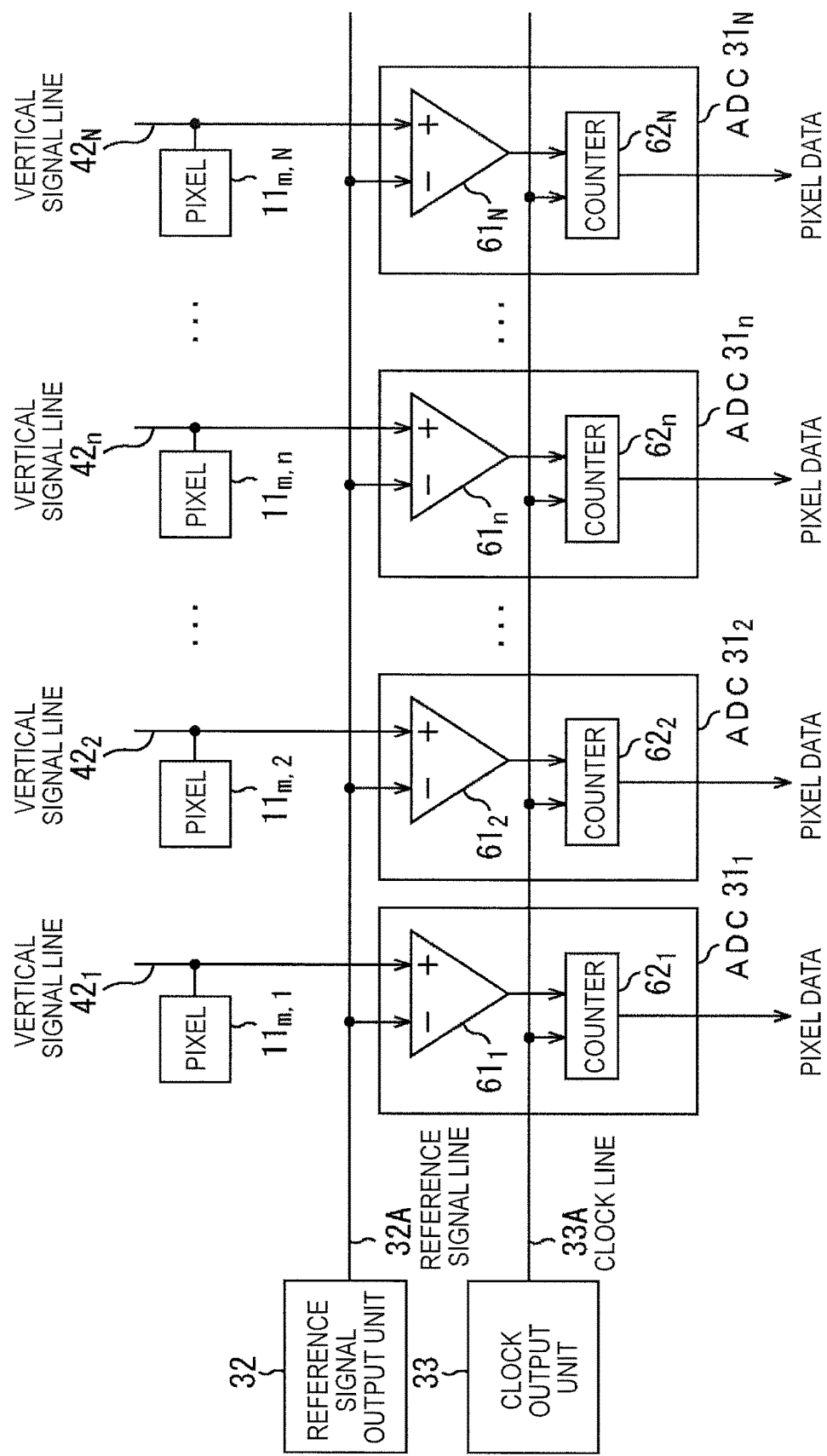
FIG. 4 is a block diagram illustrating a configuration example of an ADC $31_n$.

FIG. 4 is a block diagram illustrating a configuration example of the ADC $31_n$ of FIG. 2.

The ADC $31_n$ includes a comparator $61_n$ and a counter $62_n$, and performs reference signal comparison type ADC, and CDS.

One of the reference signal from the reference signal output unit 32 and the electrical signal (the reset level or the signal level) from the pixel $11_{m,n}$, for example, the reference signal, is supplied to an inversion input terminal (−) that is one of two input terminals of the comparator $61_n$. The other of the reference signal from the reference signal output unit 32 and the electrical signals from the pixel $11_{m,n}$, for example, the electrical signal, is supplied to a non-inversion input terminal (+) as the other of the two input terminals of the comparator $61_n$.

The comparator $61_n$ compares the reference signal supplied to the inversion input terminal with the electrical signal supplied to the non-inversion input terminal. Further, the comparator $61_n$ outputs one of H and L levels, for example, an H level, when the reference signal supplied to the inversion input terminal is higher than the voltage of the electrical signal supplied to the non-inversion input terminal.

Further, when the electrical signal supplied to the non-inversion input terminal is equal to or higher than the voltage of the reference signal supplied to the inversion input terminal (when the reference signal supplied to the inversion input terminal is equal to or lower than the voltage of the electrical signal supplied to the non-inversion input terminal), the comparator $61_n$ outputs the other of the H level and the L level, i.e., the L level.

The output of the comparator $61_n$ and the clock from the clock output unit 33 are supplied to the counter $62_n$.

When the reference signal output unit 32 supplies an initial value of the reference signal to the comparator $61_n$, the counter $62_n$ starts count of the clock from the clock output unit 33. For example, when the output of the comparator $61_n$ is changed from an H level to an L level, in other words, when the levels of the reference signal supplied to the inversion input terminal of the comparator $61_n$ and the electrical signal supplied to the non-inversion input terminal are equal, the counter $62_n$ ends the count of the clock from the clock output unit 33.

Further, the counter $62_n$ outputs a count value of the clock as an AD conversion result of the electrical signal supplied to the non-inversion input terminal of the comparator $61_n$.

Here, the reference signal output unit 32, for example, outputs a ramp signal reduced at a certain rate from a predetermined initial value (e.g., a value equal to or more than a maximum value of the electrical signal output by the pixel $11_{m,n}$) to a predetermined final value (e.g., a value equal to or less than a minimum value of the electrical signal output by the pixel $11_{m,n}$) as the reference signal.

In this case, in the counter $62_n$, the count value of the clock as a time until the ramp signal as the reference signal is changed from a predetermined initial value to the voltage (or less) of the electrical signal supplied to the non-inversion input terminal of the comparator $61_n$ is counted and becomes the AD conversion result of the electrical signal supplied to the non-inversion input terminal of the comparator $61_n$.

When the ADC $31_n$ obtains the AD conversion result of the reset level and the signal level as the electrical signal supplied from the pixel $11_{m,n}$ to the non-inversion input terminal of the comparator $61_n$, the ADC $31_n$ performs CDS by subtracting the AD conversion result of the reset level from the AD conversion result of the signal level and outputs a resultant subtraction level as the pixel data (pixel value) of the pixel $11_{m,n}$.

Further, the ADC $31_n$ may perform CDS, for example, by controlling the count of the clock in the counter $62_n$, instead of performing CDS by actually performing an operation of subtracting the AD conversion result of the reset level from the AD conversion result of the signal level.

In other words, the counter $62_n$ may perform the CDS of subtracting the reset level from the signal level while performing the AD conversion of the reset level and the signal level, for example, by counting the clock while decrementing the count value by 1 for the reset level and counting the clock while incrementing the count value by 1 for the signal level using the count value of the clock for the reset level as an initial value.

[Configuration Example of the Comparator $61_n$]

Figure 5:
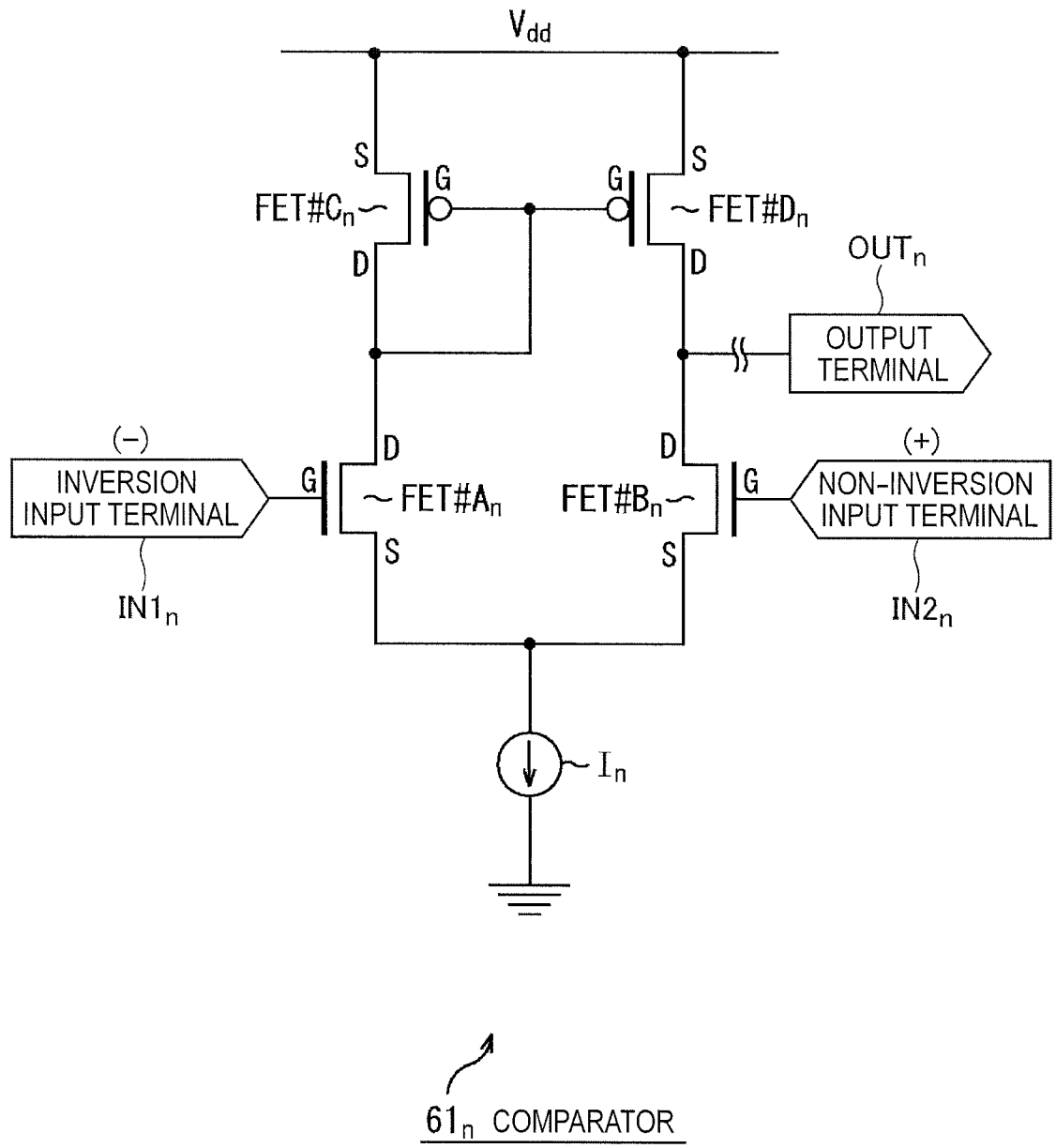
FIG. 5 is a circuit diagram illustrating a configuration example of a comparator $61_n$.

FIG. 5 is a circuit diagram illustrating a configuration example of the comparator $61_n$ in FIG. 4.

In FIG. 5, the comparator $61_n$ includes FET#$A_n$, FET#$B_n$, FET#$C_n$, FET#$D_n$, and a current source $I_n$.

FET#A$_n$ and FET#B$_n$ are NMOS (Negative Channel MOS) FETs, and sources of FET#A$_n$ and FET#B$_n$ are connected to each other. Further, a connection point between the sources of FET#A$_n$ and FET#B$_n$ is connected to the other terminal of the current source I$_n$, one end of which is grounded. FET#A$_n$ and FET#B$_n$ constitute a so-called differential pair.

A gate of FET#A$_n$ is connected to the inversion input terminal IN1$_n$ of the comparator 61$_n$, and a gate of FET#B$_n$ is connected to the non-inversion input terminal IN2$_n$ of the comparator 61$_n$.

Thus, the comparator 61$_n$ includes the differential pair including FET#A$_n$ and FET#B$_n$ at an input stage.

Here, one of FET#A$_n$ and FET#B$_n$ constituting the differential pair of the comparator 61$_n$, for example, FET#A$_n$, is referred to as a first transistor, and the other FET#B$_n$ is referred to as a second transistor.

FET#C$_n$ and FET#D$_n$ are PMOS (Positive Channel MOS) FETs, and gates of FET#C$_n$ and FET#D$_n$ are connected to each other.

Further, sources of FET#C$_n$ and FET#D$_n$ are connected to a power supply Vdd, and a connection point between the gates of FET#C$_n$ and FET#D$_n$ is connected to a drain of FET#C$_n$. Therefore, FET#C$_n$ and FET#D$_n$ constitute a current mirror.

Among FET#C$_n$ and FET#D$_n$ constituting the current mirror as described above, a drain of FET#C$_n$ is connected to a drain of FET#A$_n$, and a drain of FET#D$_n$ is connected to a drain of FET#B$_n$.

Further, a connection point between the drains of FET#B$_n$ and FET#D$_n$ is connected to an output terminal OUT$_n$ of the comparator 61$_n$.

Further, a circuit for performing desired output from the comparator 61$_n$ is provided between the connection point between the drains of FET#B$_n$ and FET#D$_n$ and the output terminal OUT$_n$, but an illustration of the circuit is omitted herein.

In the comparator 61$_n$ configured as above, when a voltage of the inversion input terminal IN1$_n$ is higher than a voltage of the non-inversion input terminal IN2$_n$, roughly, FET#A$_n$ is turned on and FET#B$_n$ is turned off. As FET#A$_n$ is turned on, FET#C$_n$ and thus FET#D$_n$ are turned on and current flows from the power supply Vdd to the output terminal OUT$_n$ via FET#D$_n$. Accordingly, the output terminal OUT$_n$ is at an H level.

On the other hand, when the voltage of the non-inversion input terminal IN2$_n$ is higher than the voltage of the inversion input terminal IN1$_n$, roughly, FET#A$_n$ is turned off and FET#B$_n$ is turned on. As FET#A$_n$ is turned off, FET#C$_n$ and FET#D$_n$ are turned off and current is drawn from the output terminal OUT$_n$ to the current source I$_n$ via FET#B$_n$. Accordingly, the output terminal OUT$_n$ is at an L level.

Further, while the comparator 61$_n$ is configured using FETs in FIG. 5, the comparator 61$_n$ may be configured of, for example, bipolar transistors or the like.

[Mounting of Image Sensor 2 on Semiconductor Chip]

Figure 6:
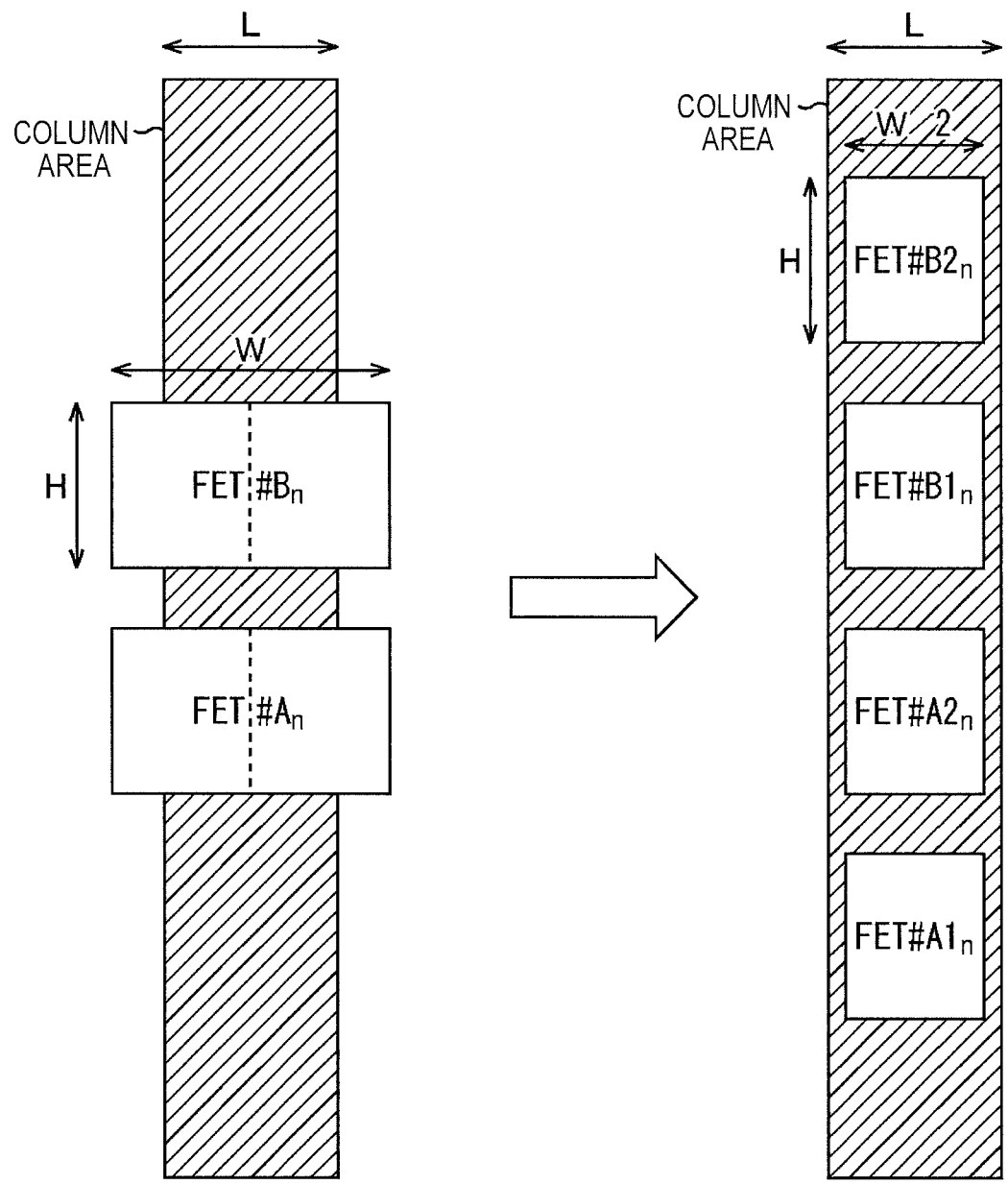
FIG. 6 is a diagram illustrating mounting of the image sensor 2 on a semiconductor chip (a paired chip)

FIG. 6 is a diagram illustrating mounting of the image sensor 2 of FIG. 2 on a semiconductor chip (paired chips).

In the image sensor 2 of FIG. 2, the N ADCs 31$_1$ to 31$_N$ included in the column parallel AD conversion unit 22 are arranged (formed) side by side in the row direction on a semiconductor chip, for example, in order to perform, in parallel, AD conversions of electrical signals of all the N pixels 11$_{m,1}$ to 11$_{m,N}$ arranged in one row.

Further, an area of the semiconductor chip in which the column parallel AD conversion unit 22 is arranged (formed) is limited due to a request for miniaturization of the CMOS image sensor 2, and an area of the semiconductor chip in which the N ADCs 31$_1$ to 31$_N$ included in the column parallel AD conversion unit 22 are arranged is also limited.

Particularly, for N ADCs 31$_1$ to 31$_N$ arranged side by side in the row direction, a width (a length in the row direction) L of one column in which one ADC 31$_n$ is arranged is limited by the number N of pixels (in the horizontal direction) per row or the like.

For example, now, a rectangular area on the semiconductor chip is assigned to arrange one ADC 31$_n$. The rectangular area is referred to as a column area.

When the width L of the column area is limited, FET#A$_n$ and FET#B$_n$ having a desired specification, which constitute the differential pair of the comparator 61$_n$ (FIG. 5) of the ADC 31$_n$, may not be arranged in the column area directly (with their sizes).

In other words, when any one of a horizontal W and a vertical H of FET#A$_n$ and FET#B$_n$ having a desired specification is greater than the width L of the column area as illustrated in FIG. 6, it is difficult to directly arrange FET#A$_n$ and FET#B$_n$ in the column area.

Accordingly, FET#A$_n$ and FET#B$_n$ are divided into the same number of a plurality of division transistors having a small size to be arranged in the column area, and are arranged in the column area, as illustrated in FIG. 6.

Here, in FIG. 6, FET#A$_n$ is divided into two FETs, FET#A1$_n$ and FET#A2$_n$ as a plurality of division transistors having the same size, which then are arranged in the column area.

FET#B$_n$ is also divided into two FET#B1$_n$ and FET#B2$_n$ having the same size and arranged in the column area, like FET#A$_n$.

Further, in FIG. 6, FET#A1$_n$, FET#A2$_n$, FET#B1$_n$ and FET#B2$_n$ are arranged in this order from a bottom in the column area.

Figure 7:
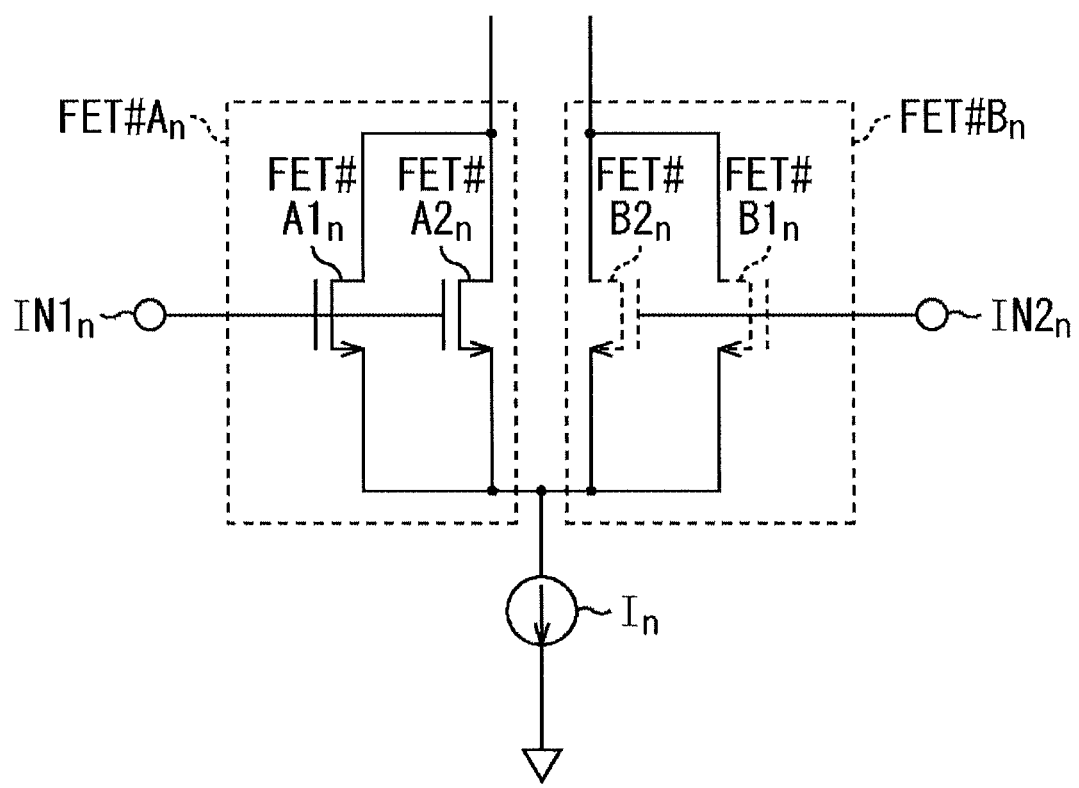
FIG. 7 is a circuit diagram illustrating a configuration example of a differential pair of the comparator $61_n$ when FET#$A_n$ and FET#$B_n$ are divided into two FET#$A1_n$ and FET#$A2_n$ and two FET#$B1_n$ and FET#$B2_n$, respectively.

FIG. 7 is a circuit diagram illustrating a configuration example of the differential pair of the comparator 61$_n$ when FET#A$_n$ and FET#B$_n$ are divided into two FET#A1$_n$ and FET#A2$_n$ and two FET#B1$_n$ and FET#B2$_n$, respectively, as illustrated in FIG. 6.

Further, in the drawings below, in order to assist in understanding, FET#A$_n$ as the first transistor and FETs into which FET#A$_n$ has been divided are illustrated by a solid line, and FET#B$_n$ as the second transistor and FETs into which FET#B$_n$ has been divided are illustrated by a dotted line.

FET#A1$_n$ and FET#A2$_n$ into which FET#A$_n$ has been divided are connected in parallel.

In other words, in FET#A1$_n$ and FET#A2$_n$ into which FET#A$_n$ has been divided, gates of FET#A1$_n$ and FET#A2$_n$ are connected to each other, drains thereof are connected to each other, and sources thereof are connected to each other.

FET#B1$_n$ and FET#B2$_n$ into which FET#B$_n$ has been divided are also connected in parallel, like FET#A1$_n$ and FET#A2$_n$.

Figure 8:
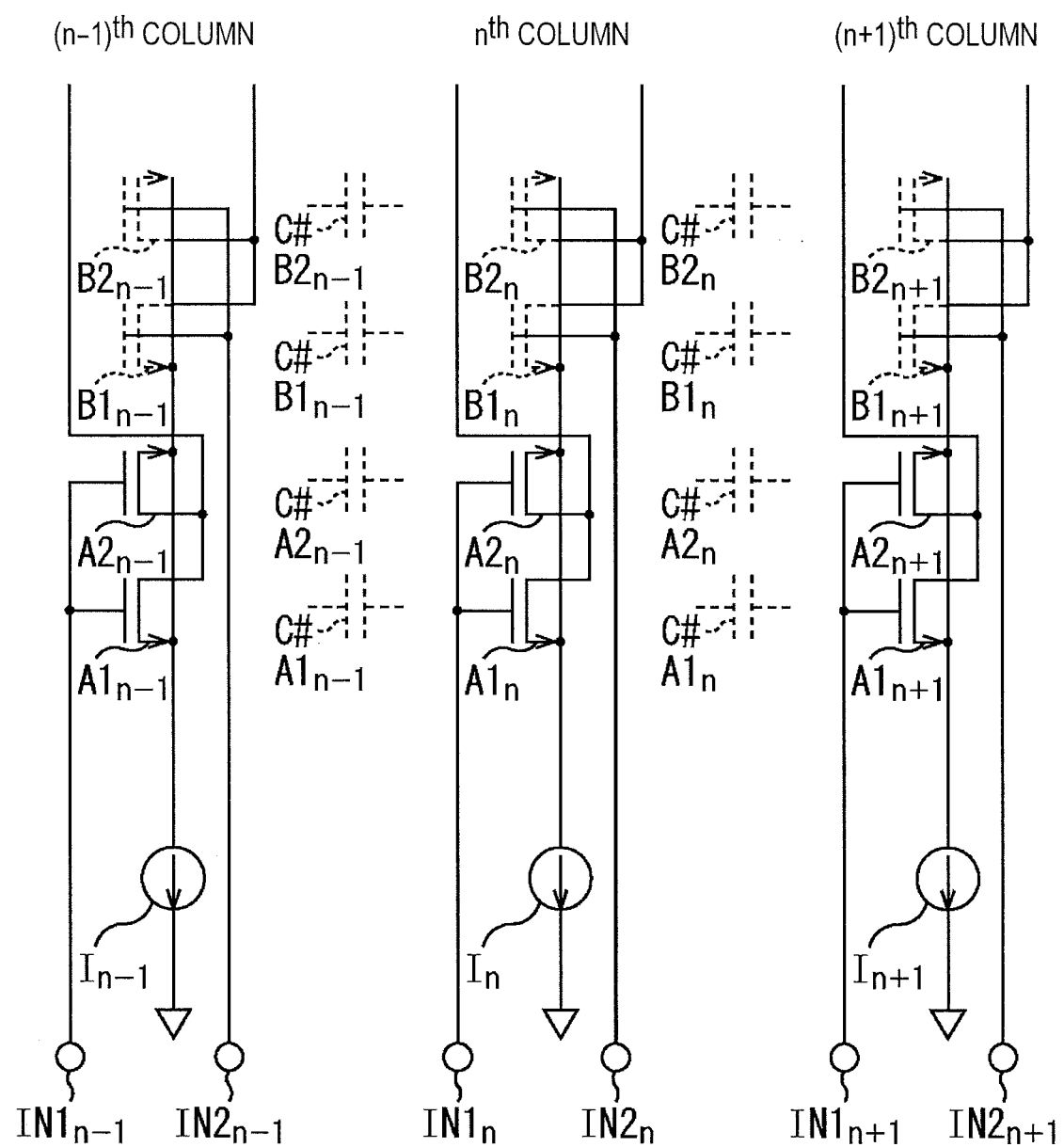
FIG. 8 is a diagram illustrating an example of an arrangement in a column area of FET#$A1_n$ and FET#$A2_n$ into which FET#$A_n$ has been divided and FET#$B1_n$ and FET#$B2_n$ into which FET#$B_n$ has been divided.

FIG. 8 is a diagram illustrating an example of an arrangement of FET#A1$_n$ and FET#A2$_n$ into which FET#A$_n$ has been divided and FET#B1$_n$ and FET#B2$_n$ into which FET#B$_n$ has been divided, in the column area.

In FIG. 8, an arrangement of three columns of FET#A1$_{n-1}$, FET#A2$_{n-1}$, FET#B1$_{n-1}$ and FET#B2$_{n-1}$ of the (n−1)$^{th}$ column (FET#A1$_{n-1}$, FET#A2$_{n-1}$, FET#B1$_{n-1}$ and FET#B2$_{n-1}$ arranged in the column area in which ADC 31$_{n-1}$ is formed), FET#A1$_n$, FET#A2$_n$, FET#B1$_n$ and FET#B2$_n$ of the n$^{th}$ column, and FET#A1$_{n+1}$, FET#A2$_{n+1}$, FET#B1$_{n+1}$ and FET#B2$_{n+1}$ of the (n+1)$^{th}$ column is illustrated (the same applies to FIGS. 10, 13, 15 and 17 that will be described below).

In the n$^{th}$ column, FET#A1$_n$, FET#A2$_n$, FET#B1$_n$ and FET#B2$_n$ are arranged in this order from a bottom as illustrated in FIG. 6. The same applies to the other columns.

In other words, in FIG. 8, an arrangement pattern of FET#A1$_n$, FET#A2$_n$, FET#B1$_n$ and FET#B2$_n$ of any n$^{th}$ column is the same as an arrangement pattern of FET#A1$_n$', FET#A2$_n$', FET#B1$_n$' and FET#B2$_n$' of any other n'$^{th}$ column.

Accordingly, in the two adjacent columns, for example, the (n−1)$^{th}$ and n$^{th}$ columns, FET#A1$_{n-1}$ of the (n−1)$^{th}$ column and FET#A1$_n$ of the n$^{th}$ column face each other, and FET#A2$_{n-1}$ of the (n−1)$^{th}$ column and FET#A2$_n$ of the n$^{th}$ column face each other. Further, FET#B1$_{n-1}$ of the (n−1)$^{th}$ column and FET#B1$_n$ of the n$^{th}$ column face each other, and FET#B2$_{n-1}$ of the (n−1)$^{th}$ column and FET#B2$_n$ of the n$^{th}$ column face each other.

Here, FET#A1$_n$ and FET#A2$_n$ into which FET#A$_n$ as the first transistor constituting the differential pair has been divided are referred to as first division FETs, and FET#B1$_n$ and FET#B2$_n$ into which FET#B$_n$ as the second transistor has been divided are referred to as second division FETs. In FIG. 8, in the (n−1)$^{th}$ and n$^{th}$ columns, the first division FET of the (n−1)$^{th}$ column and the first division FET of the n$^{th}$ column face each other, and the second division FET of the (n−1)$^{th}$ column and the second division FET of the n$^{th}$ column face each other.

A column pitch (a distance between the adjacent (n−1)$^{th}$ and n$^{th}$ columns) is small due to the request for miniaturization of the CMOS image sensor 2, and therefore, in the (n−1)$^{th}$ and n$^{th}$ columns, a parasitic capacitance coupling the facing FETs is created between the facing FETs.

In FIG. 8, the parasitic capacitance C#A1$_{n-1}$ is created between FET#A1$_{n-1}$ of the (n−1)$^{th}$ column and FET#A1$_n$ of the n$^{th}$ column that face each other. Similarly, a parasitic capacitance C#A2$_{n-1}$ is created between FET#A2$_{n-1}$ of the (n−1)$^{th}$ column and FET#A2$_n$ of the n$^{th}$ column that face each other, a parasitic capacitance C#B1$_{n-1}$ is created between FET#B1$_{n-1}$ of the (n−1)$^{th}$ column and FET#B1$_n$ of the n$^{th}$ column that face each other, and a parasitic capacitance C#B2$_{n-1}$ is created between FET#B2$_{n-1}$ of the (n−1)$^{th}$ column and FET#B2$_n$ of the n$^{th}$ column that face each other.

Further, since a distance between FET#A1$_{n-1}$ of the (n−1)$^{th}$ column and FET#A1$_n$ of the n$^{th}$ column that face each other, a distance between FET#A2$_{n-1}$ of the (n−1)$^{th}$ column and FET#A2$_n$ of the n$^{th}$ column that face each other, a distance between FET#B1$_{n-1}$ of the (n−1)$^{th}$ column and FET#B1$_n$ of the n$^{th}$ column that face each other, and a distance between FET#B2$_{n-1}$ of the (n−1)$^{th}$ column and FET#B2$_n$ of the n$^{th}$ column that face each other are equal and FET#A1$_{n-1}$, FET#A2$_{n-1}$, FET#A1$_n$ and FET#A2$_n$ have the same size, the parasitic capacitances C#A1$_{n-1}$, C#A2$_{n-1}$, C#B1$_{n-1}$ and C#B2$_{n-1}$ have (substantially) the same value.

Figure 9:
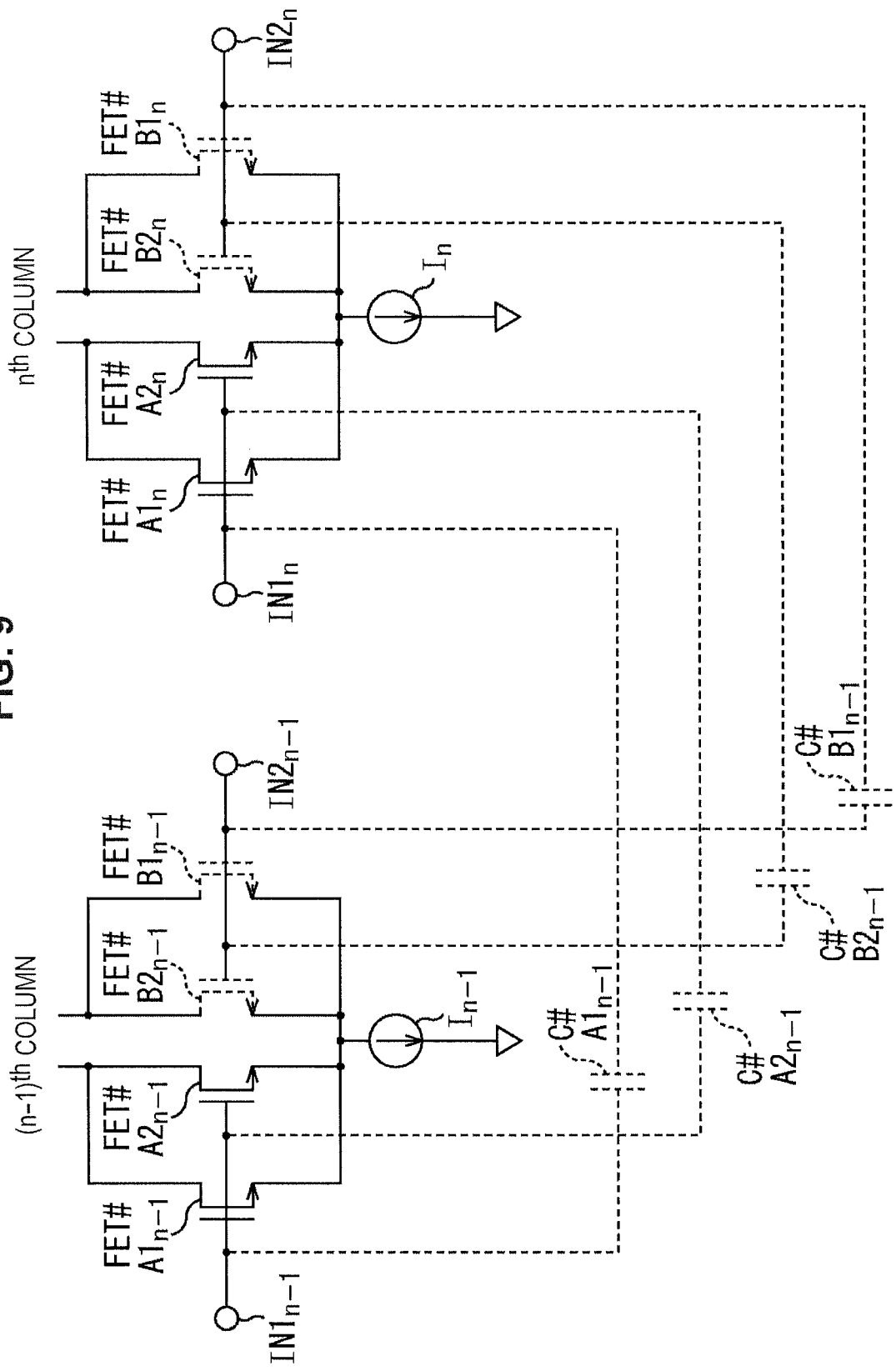
FIG. 9 is a circuit diagram illustrating a differential pair of a comparator $61_{n-1}$ in an $(n-1)^{th}$ column and a differential pair of a comparator $61_n$ in an $n^{th}$ column that are adjacent to each other, in which parasitic capacitances are created.

FIG. 9 is a circuit diagram illustrating the differential pair of the comparator 61$_{n-1}$ of the (n−1)$^{th}$ column and the differential pair of the comparator 61$_n$ of the n$^{th}$ column that are adjacent to each other, in which parasitic capacitances are created as illustrated in FIG. 8.

As illustrated in FIG. 9, the inversion input terminal IN1$_{n-1}$ (connected to the gates of FET#A1$_{n-1}$ and FET#A2$_{n-1}$) of the comparator 61$_{n-1}$ of the (n−1)$^{th}$ column and the inversion input terminal IN1$_n$ (connected to the gates of FET#A1$_n$ and FET#A2$_n$) of the comparator 61$_n$ of the n$^{th}$ column, which are adjacent, are connected by the parasitic capacitances C#A1$_{n-1}$ and C#A2$_{n-1}$.

Further, the non-inversion input terminal IN2$_{n-1}$ (connected to the gates of FET#B1$_{n-1}$ and FET#B2$_{n-1}$) of the comparator 61$_{n-1}$ of the (n−1)$^{th}$ column and the non-inversion input terminal IN2$_n$ (connected to the gates of FET#B1$_n$ and FET#B2$_n$) of the comparator 61$_n$ of the n$^{th}$ column, which are adjacent, are connected by the parasitic capacitances C#B1$_{n-1}$ and C#B2$_{n-1}$.

Accordingly, for example, if voltage fluctuation occurs in the inversion input terminal IN1$_{n-1}$ of the comparator 61$_{n-1}$ of the (n−1)$^{th}$ column due to noise or the like, the voltage fluctuation influences the inversion input terminal IN1$_n$ of the comparator 61$_n$ of the n$^{th}$ column adjacent to the (n−1)$^{th}$ column via the parasitic capacitances C#A1$_{n-1}$ and C#A2$_{n-1}$ and, as a result, fluctuates an output (a voltage of the output terminal OUT$_n$) of the comparator 61$_n$ of the n$^{th}$ column.

Similarly, for example, when voltage fluctuation occurs in the non-inversion input terminal IN2$_{n-1}$ of the comparator 61$_{n-1}$ of the (n−1)$^{th}$ column due to noise or the like, the voltage fluctuation influences the non-inversion input terminal IN2$_n$ of the comparator 61$_n$ of the n$^{th}$ column adjacent to the (n−1)$^{th}$ column via the parasitic capacitances C#B1$_{n-1}$ and C#B2$_{n-1}$ and, as a result, fluctuates the output of the comparator 61$_n$ of the n$^{th}$ column.

Further, the voltage fluctuation of the inversion input terminal IN1$_n$ or the non-inversion input terminal IN2$_n$ of the comparator 61$_n$ of the n$^{th}$ column influences the inversion input terminal IN1$_{n+1}$ or the non-inversion input terminal IN2$_{n+1}$ of the comparator 61$_{n+1}$ of the (n+1)$^{th}$ column via parasitic capacitances between the n$^{th}$ column and the (n+1)$^{th}$ column, like the voltage fluctuation of the inversion input terminal IN1$_{n-1}$ and the non-inversion input terminal IN2$_{n-1}$ of the comparator 61$_{n-1}$ of the (n−1)$^{th}$ column.

Thus, the voltage fluctuation of the inversion input terminal IN1$_{n-1}$ or the non-inversion input terminal IN2$_{n-1}$ of the comparator 61$_{n-1}$ of the (n−1)$^{th}$ column influences the inversion input terminal IN1$_n$ and the non-inversion input terminal IN2$_n$ of the comparator 61$_n$ of the n$^{th}$ column adjacent to the (n−1)$^{th}$ column, as well as the inversion input terminal IN1$_{n+1}$ or the non-inversion input terminal IN2$_{n+1}$ of the comparator 61$_{n+1}$ of the (n+1)$^{th}$ column via the parasitic capacitances between the n$^{th}$ column and the (n+1)$^{th}$ column.

Hereinafter, similarly, the voltage fluctuation of the inversion input terminal IN1$_{n-1}$ and the non-inversion input terminal IN2$_{n-1}$ of the comparator 61$_{n-1}$ of the (n−1)$^{th}$ column propagates to other columns in a chain reaction via the parasitic capacitances, which deteriorates a crosstalk characteristic of the column parallel AD conversion unit 22.

When the arrangement pattern of FET#A1$_n$, FET#A2$_n$, FET#B1$_n$ and FET#B2$_n$ of any n$^{th}$ column and the arrangement pattern of FET#A1$_n$', FET#A2$_n$', FET#B1$_n$' and FET#B2$_n$' of any other n'$^{th}$ column are the same as illustrated in FIG. 8, the voltage fluctuation of the inversion input terminal IN1$_n$ or the non-inversion input terminal IN2$_n$ of the comparator 61$_n$ of any n$^{th}$ column propagates to other columns via the parasitic capacitance, which deteriorates a crosstalk characteristic of the column parallel AD conversion unit 22.

[Arrangement of FET#A$_n$ and FET#B$_n$ Improving Crosstalk Characteristic]

Figure 10:
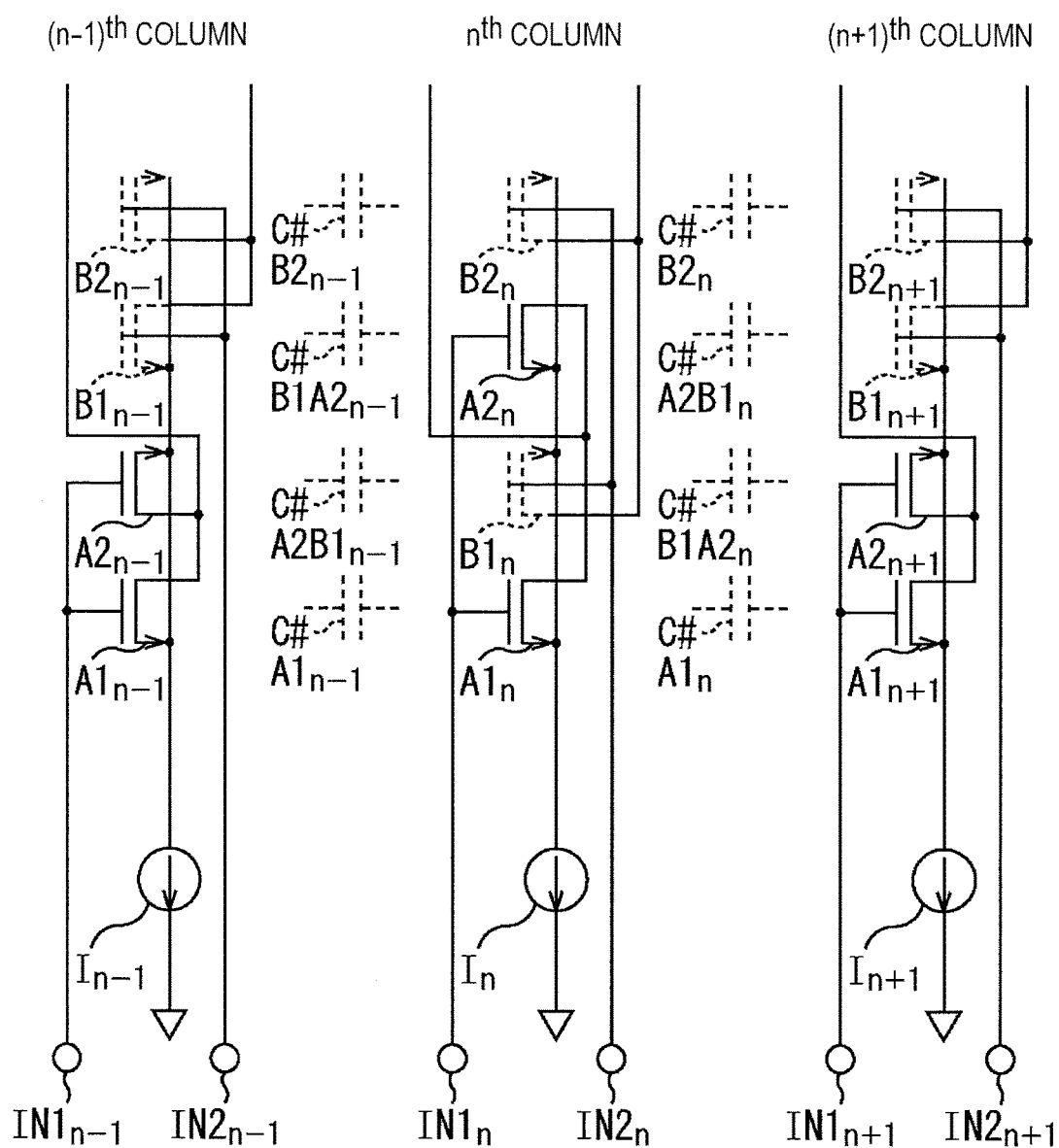
FIG. 10 is a diagram illustrating a first example of an arrangement of FET#$A_n$ and FET#$B_n$ improving a crosstalk characteristic.

FIG. 10 is a diagram illustrating a first example of the arrangement of FET#A$_n$ and FET#B$_n$ improving a crosstalk characteristic.

In FIG. 10, FET#A$_n$ and FET#B$_n$ are divided into FET#A1$_n$ and FET#A2$_n$ as two first division FETs and FET#B1$_n$ and FET#B2$_n$ as two second division FETs, respectively, as in the case of FIG. 8.

Further, in FIG. 10, FET#A1$_{n-1}$, FET#A2$_{n-1}$, FET#B1$_{n-1}$ and FET#B2$_{n-1}$ of any (n−1)$^{th}$ column and FET#A1$_n$, FET#A2$_n$, FET#B1$_n$ and FET#B2$_n$ of the n$^{th}$ column (adjacent column) adjacent to the (n−1)$^{th}$ column are arranged so that an arrangement pattern of FET#A1$_{n-1}$, FET#A2$_{n-1}$, FET#B1$_{n-1}$ and FET#B2$_{n-1}$ of the (n−1)$^{th}$ column and an arrangement pattern of FET#A1$_n$, FET#A2$_n$, FET#B1$_n$ and FET#B2$_n$ of the n$^{th}$ column are different from each other.

In other words, in FIG. 10, the first division FETs (FET#A1$_{n-1}$ and FET#A2$_{n-1}$) and the second division FETs (FET#B1$_{n-1}$ and FET#B2$_{n-1}$) of the (n−1)$^{th}$ column and the first division FETs (FET#A1$_n$ and FET#A2$_n$) and the second division FETs (FET#B1$_n$ and FET#B2$_n$) of the n$^{th}$ column are arranged so that parasitic capacitance coupling between FET#A$_{n-1}$ as the first transistor of the (n−1)$^{th}$ column and each of FET#A$_n$ as the first transistor and FET#B$_n$ as the second transistor of the n$^{th}$ column (adjacent column) adjacent to the (n−1)$^{th}$ column is created and parasitic capacitance coupling between FET#B$_{n-1}$ as the second transistor of the (n−1)$^{th}$ column and each of FET#A$_n$ as the first transistor and FET#B$_n$ as the second transistor of the n$^{th}$ column adjacent to the (n−1)$^{th}$ column is created.

More specifically, in the (n−1)$^{th}$ column and the n$^{th}$ column, FET#A1$_{n-1}$, FET#A2$_{n-1}$, FET#B1$_{n-1}$ and FET#B2$_{n-1}$ of the (n−1)$^{th}$ column and FET#A1$_n$, FET#A2$_n$, FET#B1$_n$ and FET#B2$_n$ of the n$^{th}$ column are arranged so that all of the first number num11 of the first division FET of the (n−1)$^{th}$ column and the first division FET of the n$^{th}$ column that face each other, the second number num22 of the second division FET of the (n−1)$^{th}$ column and the second division FET of the n$^{th}$ column that correspond to each other, the third number num12 of the first division FET of the (n−1)$^{th}$ column and the second division FET of the n$^{th}$ column that face each other, and the fourth number num21 of the second division FET of the (n−1)$^{th}$ column and the first division FET of the n$^{th}$ column that face each other are equal.

Here, FET#A1$_{n-1}$, FET#A2$_{n-1}$, FET#B1$_{n-1}$ and FET#B2$_{n-1}$ being arranged in this order from the bottom in the (n−1)$^{th}$ column (the same applies to . . . , the (n−5)$^{th}$ column, the (n−3)$^{th}$ column, the (n+1)$^{th}$ column, the (n+3)$^{th}$ column, . . . ) is common to FIG. 10 and FIG. 8.

However, FIG. 10 is different from FIG. 8 in which FET#A1$_n$, FET#A2$_n$, FET#B1$_n$ and FET#B2$_n$ in the n$^{th}$ column are arranged in the same order of FET#A1$_n$, FET#A2$_n$, FET#B1$_n$ and FET#B2$_n$ as the (n−1)$^{th}$ column, in that FET#A1$_n$, FET#A2$_n$, FET#B1$_n$ and FET#B2$_n$ in the n$^{th}$ column adjacent to the (n−1)$^{th}$ column are arranged in order of FET#A1$_n$, FET#B1$_n$, FET#A2$_n$ and FET#B2$_n$ from the bottom (the same applies to . . . , the (n−4)$^{th}$ column, the (n−2)$^{th}$ column, the (n+2)$^{th}$ column, the (n+4)$^{th}$ column, . . . ).

Accordingly, in FIG. 10, in the adjacent (n−1)$^{th}$ and n$^{th}$ columns, FET#A1$_{n-1}$ of the (n−1)$^{th}$ column and FET#A1$_n$ of the n$^{th}$ column face each other, and FET#B2$_{n-1}$ of the (n−1)$^{th}$ column and FET#B2$_n$ of the n$^{th}$ column face each other. Further, a parasitic capacitance C#A1$_{n-1}$ is created between FET#A1$_{n-1}$ of the (n−1)$^{th}$ column and FET#A1$_n$ of the n$^{th}$ column that face each other, and a parasitic capacitance C#B2$_{n-1}$ is created between FET#B2$_{n-1}$ of the (n−1)$^{th}$ column and FET#B2$_n$ of the n$^{th}$ column that face each other. This point is common to FIG. 8.

Further, in FIG. 10, in the adjacent (n−1)$^{th}$ and n$^{th}$ columns, FET#A2$_{n-1}$ of the (n−1)$^{th}$ column and FET#B1$_n$ of the n$^{th}$ column face each other, and FET#B1$_{n-1}$ of the (n−1)$^{th}$ column and FET#A2$_n$ of the n$^{th}$ column face each other. Further, a parasitic capacitance C#A2B1$_{n-1}$ is created between FET#A2$_{n-1}$ of the (n−1)$^{th}$ column and FET#B1$_n$ of the n$^{th}$ column that face each other, and a parasitic capacitance C#B1A2$_{n-1}$ is created between FET#B1$_{n-1}$ of the (n−1)$^{th}$ column and FET#A2$_n$ of the n$^{th}$ column that face each other. This point differs from FIG. 8.

Here, in FIG. 10, in the (n−1)$^{th}$ column and the n$^{th}$ column, the first number num11 of the first division FET of the (n−1)$^{th}$ column and the first division FET of the n$^{th}$ column that face each other is only 1, i.e., a set of FET#A1$_{n-1}$ of the (n−1)$^{th}$ column and FET#A1$_n$ of the n$^{th}$ column.

Further, the second number num22 of the second division FET of the (n−1)$^{th}$ column and the second division FET of the n$^{th}$ column that correspond to each other is only 1, i.e., a set of FET#B2$_{n-1}$ of the (n−1)$^{th}$ column and FET#B2$_n$ of the n$^{th}$ column.

Further, the third number num12 of the first division FET of the (n−1)$^{th}$ column and the second division FET of the n$^{th}$ column that face each other is only 1, i.e., FET#A2$_{n-1}$ of the (n−1)$^{th}$ column and FET#B1$_n$ of the n$^{th}$ column, and the fourth number num21 of the second division FET of the (n−1)$^{th}$ column and the first division FET of the n$^{th}$ column that face each other is only 1, i.e., FET#B1$_{n-1}$ of the (n−1)$^{th}$ column and FET#A2$_n$ of the n$^{th}$ column.

Accordingly, the first number num11, the second number num22, the third number num12, and the fourth number num21 are all 1 and are equal.

Further, the parasitic capacitances C#A1$_{n-1}$, C#A2B1$_{n-1}$, C#B1A2$_{n-1}$ and C#B2$_{n-1}$ have (substantially) the same value for the same reason as the parasitic capacitances C#A1$_{n-1}$, C#A2$_{n-1}$, C#B1$_{n-1}$ and C#B2$_{n-1}$ described with reference to FIG. 8.

Figure 11:
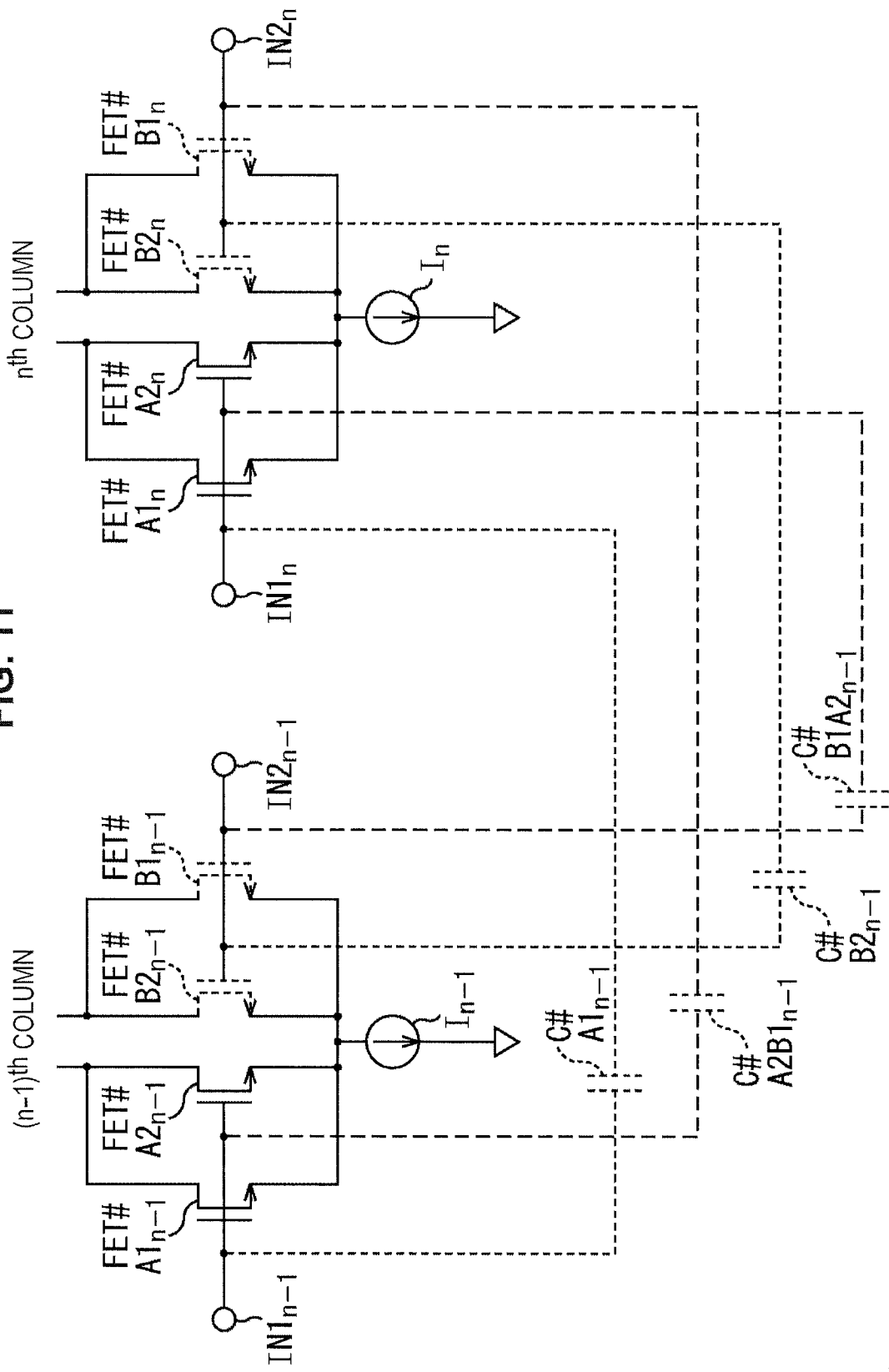
FIG. 11 is a circuit diagram illustrating a differential pair of a comparator $61_{n-1}$ in an $(n-1)^{th}$ column and a differential pair of a comparator $61_n$ in an $n^{th}$ column that are adjacent to each other, in which parasitic capacitances are created.
Figure 12:
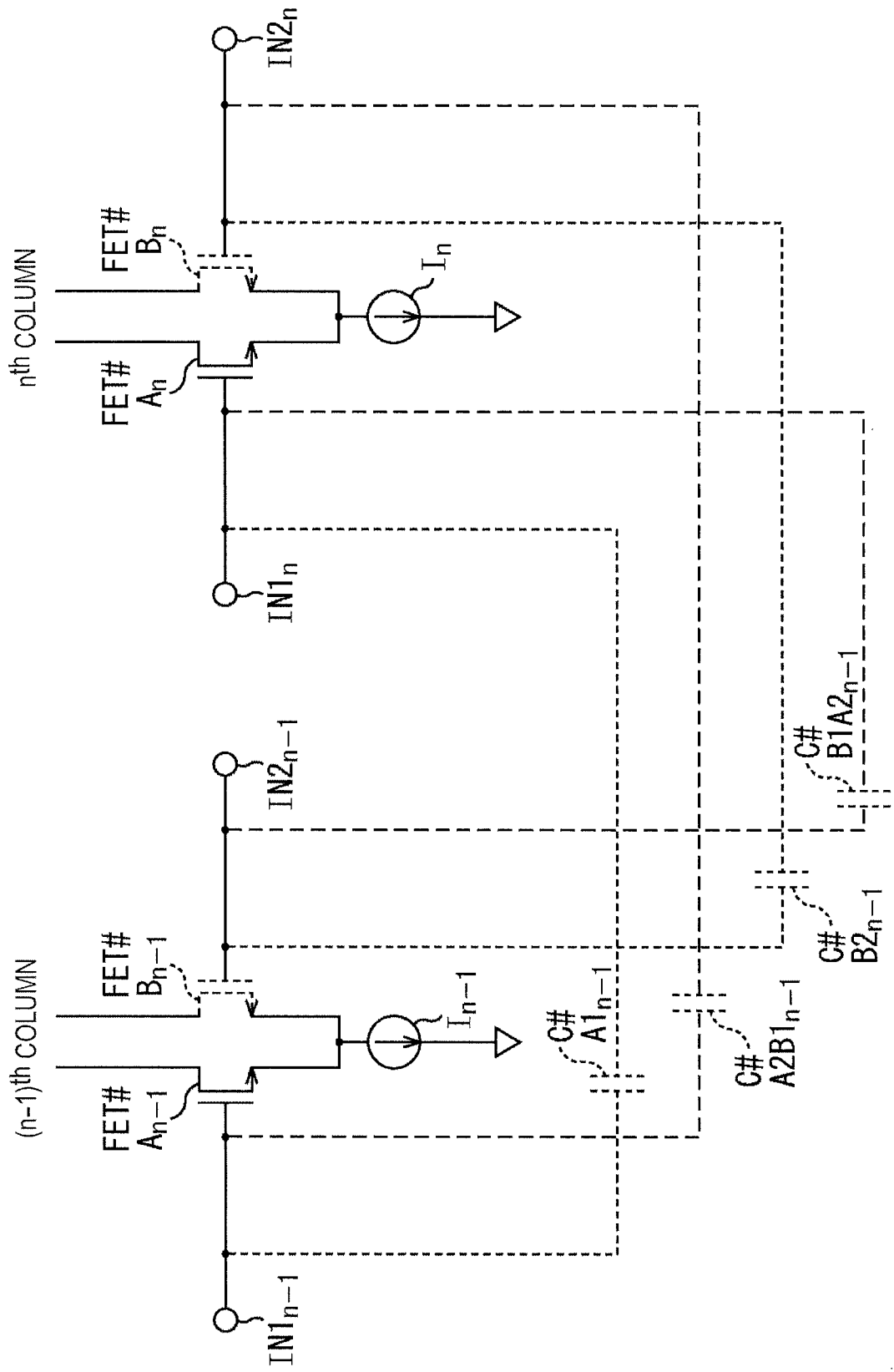
FIG. 12 is a circuit diagram illustrating a differential pair of a comparator $61_{n-1}$ in an $(n-1)^{th}$ column and a differential pair of a comparator $61_n$ in an $n^{th}$ column that are adjacent to each other, in which parasitic capacitances are created.

FIGS. 11 and 12 are circuit diagrams illustrating the differential pair of the comparator 61$_{n-1}$ of the (n−1)$^{th}$ column and the differential pair of the comparator 61$_n$ of the n$^{th}$ column, which are adjacent to each other, between which parasitic capacitances are created as illustrated in FIG. 10.

Further, FIG. 11 is a circuit diagram illustrating FET#A$_n$ and FET#B$_n$ constituting the differential pair of the comparator 61$_n$ using FET#A1$_n$, FET#A2$_n$, FET#B1$_n$ and FET#B2$_n$ obtained by dividing FET#A$_n$ and FET#B$_n$, and FIG. 12 is a circuit diagram illustrating FET#A$_n$ and FET#B$_n$ constituting the differential pair of the comparator 61$_n$ as they are without dividing FET#A$_n$ and FET#B$_n$. Accordingly, FIGS. 11 and 12 are substantially the same circuit diagrams.

As illustrated in FIGS. 11 and 12, the inversion input terminal IN1$_{n-1}$ (connected to the gate of FET#A$_{n-1}$ (FET#A1$_{n-1}$ and FET#A2$_{n-1}$)) of the comparator 61$_{n-1}$ of the (n−1)$^{th}$ column and the inversion input terminal IN1$_n$ (connected to the gate of FET#A$_n$ (FET#A1$_n$ and FET#A2$_n$)) of the comparator 61$_n$ of the n$^{th}$ column, which are adjacent to each other, are connected by a parasitic capacitance C#A1$_{n-1}$. This point is common to the case of FIG. 9.

Further, the non-inversion input terminal IN2$_{n-1}$ (connected to the gate of FET#B$_{n-1}$ (FET#B1$_{n-1}$ and FET#B2$_{n-1}$) of the comparator 61$_{n-1}$ of the (n−1)$^{th}$ column and the non-inversion input terminal IN2$_n$ (connected to the gate of FET#B$_n$ (FET#B1$_n$ and FET#B2$_n$) of the comparator 61$_n$ of the n$^{th}$ column, which are adjacent to each other, are connected by a parasitic capacitance C#B2$_{n-1}$. This point is also common to the case of FIG. 9.

However, in FIGS. 11 and 12, the inversion input terminal IN1$_{n-1}$ (connected to the gate of FET#A$_{n-1}$) of the comparator 61$_{n-1}$ of the (n−1)$^{th}$ column and the non-inversion input terminal IN2$_n$ (connected to the gate of FET#B$_n$) of the comparator $61_n$ of the $n^{th}$ column, which are adjacent to each other, are connected by a parasitic capacitance $C\#A2B1_{n-1}$.

Further, the non-inversion input terminal $IN2_{n-1}$ (connected to the gate of $FET\#B_{n-1}$) of the comparator $61_{n-1}$ of the $(n-1)^{th}$ column and the inversion input terminal $IN1_n$ (connected to the gate of $FET\#A_n$) of the comparator $61_n$ of the $n^{th}$ column are connected by a parasitic capacitance $C\#B1A2_{n-1}$.

Accordingly, for example, when voltage fluctuation caused by noise or the like occurs in the inversion input terminal $IN1_{n-1}$ of the comparator $61_{n-1}$ of the $(n-1)^{th}$ column, the voltage fluctuation influences the inversion input terminal $IN1_n$ of the comparator $61_n$ of the $n^{th}$ column adjacent to the $(n-1)^{th}$ column via the parasitic capacitance $C\#A1_{n-1}$. This is the same as the case of FIG. 9.

However, in FIGS. 11 and 12, when the voltage fluctuation caused by noise or the like occurs in the inversion input terminal $IN1_{n-1}$ of the comparator $61_{n-1}$ of the $(n-1)^{th}$ column, the voltage fluctuation influences the non-inversion input terminal $IN2_n$ of the comparator $61_n$ of the $n^{th}$ column adjacent to the $(n-1)^{th}$ column via the parasitic capacitance $C\#A2B1_{n-1}$.

As described with reference to FIG. 10, the parasitic capacitance $C\#A1_{n-1}$ and $C\#A2B1_{n-1}$ have the same value, and therefore a degree of the voltage fluctuation occurring in the inversion input terminal $IN1_{n-1}$ of the comparator $61_{n-1}$ of the $(n-1)^{th}$ column influencing the inversion input terminal $IN1_n$ of the comparator $61_n$ of the $n^{th}$ column adjacent to the $(n-1)^{th}$ column via the parasitic capacitance $C\#A1_{n-1}$ and a degree of the voltage fluctuation influencing the non-inversion input terminal $IN2_n$ of the comparator $61_n$ via the parasitic capacitance $C\#A2B1_{n-1}$ are the same.

In other words, when the voltage fluctuation occurs in the inversion input terminal $IN1_{n-1}$ of the comparator $61_{n-1}$ of the $(n-1)^{th}$ column, the voltage fluctuation occurring in the inversion input terminal $IN1_n$ of the comparator $61_n$ of the $n^{th}$ column via the parasitic capacitance $C\#A1_{n-1}$ and the voltage fluctuation occurring in the non-inversion input terminal $IN2_n$ of the comparator $61_n$ of the $n^{th}$ column via the parasitic capacitance $C\#A2B1_{n-1}$ are of the same degree.

In the differential pair ($FET\#A_n$ and $FET\#B_n$) to which the inversion input terminal $IN1_n$ and the non-inversion input terminal $IN2_n$ are connected in the comparator $61_n$ of the $n^{th}$ column, since the voltage fluctuations of the same degree occurring in both the inversion input terminal $IN1_n$ and the non-inversion input terminal $IN2_n$ are in-phase signals, the voltage fluctuations are canceled (canceled out) and do not influence the output (the voltage of output terminal $OUT_n$) of the comparator $61_n$ of the $n^{th}$ column.

Further, for example, when the voltage fluctuation caused by noise or the like occurs in the non-inversion input terminal $IN2_{n-1}$ of the comparator $61_{n-1}$ of the $(n-1)^{th}$ column, the voltage fluctuation influences the non-inversion input terminal $IN2_n$ of the comparator $61_n$ of the $n^{th}$ column adjacent to the $(n-1)^{th}$ column via the parasitic capacitance $C\#B2_{n-1}$ and influences the inversion input terminal $IN1_n$ of the comparator $61_n$ of the $n^{th}$ column adjacent to the $(n-1)^{th}$ column via the parasitic capacitance $C\#B1A2_{n-1}$, and voltage fluctuations of the same degree occur in the inversion input terminal $IN1_n$ and the non-inversion input terminal $IN2_n$ of the comparator $61_n$ of the $n^{th}$ column.

In the differential pair to which the inversion input terminal $IN1_n$ and the non-inversion input terminal $IN2_n$ are connected in the comparator $61_n$ of the $n^{th}$ column, since the voltage fluctuations of the same degree occurring in both the inversion input terminal $IN1_n$ and the non-inversion input terminal $IN2_n$ are in-phase signals, the voltage fluctuations are canceled and do not influence the output of the comparator $61_n$ of the $n^{th}$ column.

Further, the voltage fluctuation of the inversion input terminal $IN1_n$ or the non-inversion input terminal $IN2_n$ of the comparator $61_n$ of the $n^{th}$ column influences the inversion input terminal $IN1_{n+1}$ or the non-inversion input terminal $IN2_{n+1}$ of the comparator $61_{n+1}$ of the $(n+1)^{th}$ column via the parasitic capacitance between the $n^{th}$ column and the $(n+1)^{th}$ column, but in the differential pair of the comparator $61_{n+1}$ of the $(n+1)^{th}$ column, the voltage fluctuations are canceled and do not influence the output of the comparator $61_{n+1}$ of the $(n+1)^{th}$ column, as in the above-described case.

Accordingly, the voltage fluctuation of the inversion input terminal $IN1_{n-1}$ or the non-inversion input terminal $IN2_{n-1}$ of the comparator $61_{n-1}$ of the $(n-1)^{th}$ column does not influence the output of the comparator $61_n$ of the $n^{th}$ column adjacent to the $(n-1)^{th}$ column and also does not influence the output of the comparator $61_{n+1}$ of the $(n+1)^{th}$ column via the parasitic capacitance between the $n^{th}$ column and the $(n+1)^{th}$ column.

Since the voltage fluctuation of the inversion input terminal $IN1_{n-1}$ or the non-inversion input terminal $IN2_{n-1}$ of the comparator $61_{n-1}$ of the $(n-1)^{th}$ column does not influence the output of the comparator $61_n'$ of another column via the parasitic capacitance as described above, it is possible to improve a crosstalk characteristic of the column parallel AD conversion unit 22.

In other words, it is possible to disperse the parasitic capacitances created between the adjacent $(n-1)^{th}$ and $n^{th}$ columns so that the crosstalk is canceled in the differential pair of the comparator $61_n$ by arranging $FET\#A1_{n-1}$, $FET\#A2_{n-1}$, $FET\#B1_{n-1}$ and $FET\#B2_{n-1}$ of the $(n-1)^{th}$ column and $FET\#A1_n$, $FET\#A2_n$, $FET\#B1_n$ and $FET\#B2_n$ of the $n^{th}$ column such that the arrangement pattern of $FET\#A1_{n-1}$, $FET\#A2_{n-1}$, $FET\#B1_{n-1}$ and $FET\#B2_{n-1}$ of any $(n-1)^{th}$ column and an arrangement pattern of $FET\#A1_n$, $FET\#A2_n$, $FET\#B1_n$ and $FET\#B2_n$ of the $n^{th}$ column (adjacent column) adjacent to the $(n-1)^{th}$ column are different, and as a result, it is possible to improve the crosstalk characteristic without particularly causing a side effect.

Figure 13:
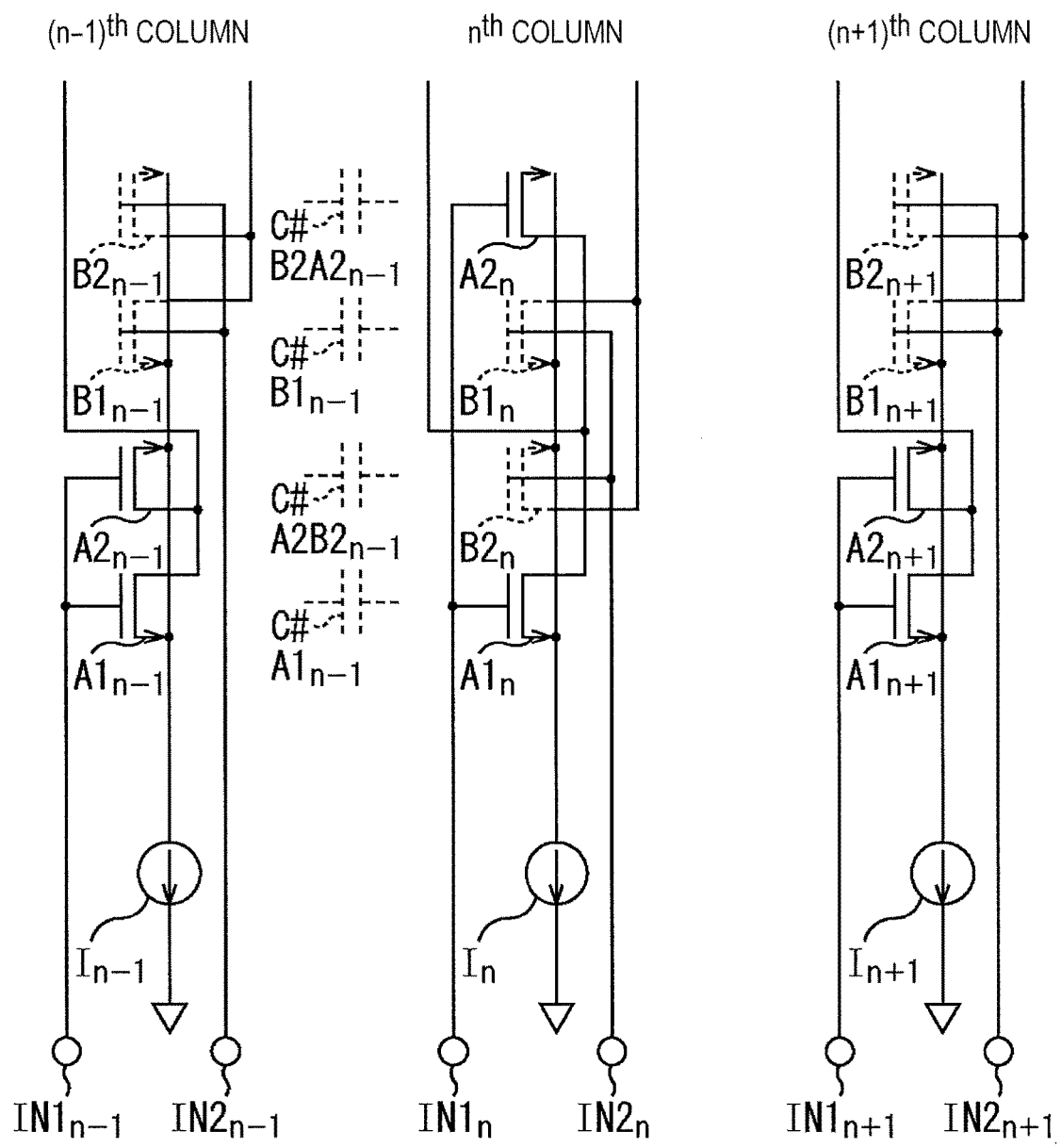
FIG. 13 is a diagram illustrating a second example of an arrangement of FET#$A_n$ and FET#$B_n$ improving a crosstalk characteristic.

FIG. 13 is a diagram illustrating a second example of the arrangement of $FET\#A_n$ and $FET\#B_n$ improving a crosstalk characteristic.

Further, an illustration of (a capacitor indicating) the parasitic capacitance between the $n^{th}$ column and the $(n+1)^{th}$ column is omitted in FIG. 13 (the same applies to the drawings below).

In FIG. 13, $FET\#A_n$ and $FET\#B_n$ are divided into $FET\#A1_n$ and $FET\#A2_n$ as two first division FETs and $FET\#B1_n$ and $FET\#B2_n$ as two second division FETs, respectively, as in the cases of FIGS. 8 and 10.

In FIG. 13, $FET\#A1_{n-1}$, $FET\#A2_{n-1}$, $FET\#B1_{n-1}$ and $FET\#B2_{n-1}$ are arranged in this order from a bottom in the $(n-1)^{th}$ column (the same applies to . . . , the $(n-5)^{th}$ column, the $(n-3)^{th}$ column, the $(n+1)^{th}$ column, the $(n+3)^{th}$ column, . . . ).

Further, in FIG. 13, $FET\#A1_n$, $FET\#A2_n$, $FET\#B1_n$ and $FET\#B2_n$ are arranged in order of $FET\#A1_n$, $FET\#B2_n$, $FET\#B1_n$ and $FET\#A2_n$ from the bottom in the $n^{th}$ column adjacent to the $(n-1)^{th}$ column (the same applies to . . . , the $(n-4)^{th}$ column, the $(n-2)^{th}$ column, the $(n+2)^{th}$ column, the $(n+4)^{th}$ column, . . . ).

Accordingly, even in FIG. 13, the first division FETs ($FET\#A1_{n-1}$ and $FET\#A2_{n-1}$) and the second division FETs ($FET\#B1_{n-1}$ and $FET\#B2_{n-1}$) of the $(n-1)^{th}$ column, and the first division FETs ($FET\#A1_n$ and $FET\#A2_n$) and the second division FETs ($FET\#B1_n$ and $FET\#B2_n$) of the $n^{th}$ column are arranged so that parasitic capacitance coupling between FET#A$_{n-1}$ as the first transistor of the (n−1)$^{th}$ column and each of FET#A$_n$ as the first transistor and FET#B$_n$ as the second transistor of the n$^{th}$ column (adjacent column) adjacent to the (n−1)$^{th}$ column is created and parasitic capacitance coupling between FET#B$_{n-1}$ as the second transistor of the (n−1)$^{th}$ column and each of FET#A$_n$ as the first transistor and FET#B$_n$ of the second transistor of the n$^{th}$ column adjacent to the (n−1)$^{th}$ column is created, as in the case of FIG. 10.

Further, in FIG. 13, in (n−1)$^{th}$ and n$^{th}$ columns, FET#A1$_{n-1}$, FET#A2$_{n-1}$, FET#B1$_{n-1}$ and FET#B2$_{n-1}$ of the (n−1)$^{th}$ column and FET#A1$_n$, FET#A2$_n$, FET#B1$_n$ and FET#B2$_n$ of the n$^{th}$ column are arranged so that all of the first number num11 of the first division FET of the (n−1)$^{th}$ column and the first division FET of the n$^{th}$ column that face each other, the second number num22 of the second division FET of the (n−1)$^{th}$ column and the second division FET of the n$^{th}$ column that correspond to each other, the third number num12 of the first division FET of the (n−1)$^{th}$ column and the second division FET of the n$^{th}$ column that face each other, and the fourth number num21 of the second division FET of the (n−1)$^{th}$ column and the first division FET of the n$^{th}$ column that face each other are equal, as in the case of FIG. 10.

In other words, in FIG. 13, in the adjacent (n−1)$^{th}$ and n$^{th}$ columns, FET#A1$_{n-1}$ of the (n−1)$^{th}$ column and FET#A1$_n$ of the n$^{th}$ column face each other, and FET#B1$_{n-1}$ of the (n−1)$^{th}$ column and FET#B1$_n$ of the n$^{th}$ column face each other. Further, the parasitic capacitance C#A1$_{n-1}$ is created between FET#A1$_{n-1}$ of the (n−1)$^{th}$ column and FET#A1$_n$ of the n$^{th}$ column that face each other, and the parasitic capacitance C#B1$_{n-1}$ is created between FET#B1$_{n-1}$ of the (n−1)$^{th}$ column and FET#B1$_n$ of the n$^{th}$ column that face each other.

Further, in FIG. 13, in the adjacent (n−1)$^{th}$ and n$^{th}$ columns, FET#A2$_{n-1}$ of the (n−1)$^{th}$ column and FET#B2$_n$ of the n$^{th}$ column face each other, and FET#B2$_{n-1}$ of the (n−1)$^{th}$ column and FET#A2$_n$ of the n$^{th}$ column face each other. Further, a parasitic capacitance C#A2B2$_{n-1}$ is created between FET#A2$_{n-1}$ of the (n−1)$^{th}$ column and FET#B2$_n$ of the n$^{th}$ column that face each other, and a parasitic capacitance C#B2A2$_{n-1}$ is created between FET#B2$_{n-1}$ of the (n−1)$^{th}$ column and FET#A2$_n$ of the n$^{th}$ column that face each other.

Accordingly, in FIG. 13, in the (n−1)$^{th}$ column and the n$^{th}$ column, the first number num11 of the first division FET of the (n−1)$^{th}$ column and the first division FET of the n$^{th}$ column that face each other is only 1, i.e., a set of FET#A1$_{n-1}$ of the (n−1)$^t$ column and FET#A$_n$ of the n$^{th}$ column.

Further, the second number num22 of the second division FET of the (n−1)$^{th}$ column and the second division FET of the n$^{th}$ column that correspond to each other is only 1, i.e., a set of FET#B1$_{n-1}$ of the (n−1)$^{th}$ column and FET#B1$_n$ of the n$^{th}$ column.

Further, the third number num12 of the first division FET of the (n−1)$^{th}$ column and the second division FET of the n$^{th}$ column that face each other is only 1, i.e., a set of FET#A2$_{n-1}$ of the (n−1)$^{th}$ column and FET#B2$_n$ of the n$^{th}$ column, and the fourth number num21 of the second division FET of the (n−1)$^{th}$ column and the first division FET of the n$^{th}$ column that face each other is only 1, i.e., a set of FET#B2$_{n-1}$ of the (n−1)$^{th}$ column and FET#A2$_n$ of the n$^{th}$ column.

Accordingly, the first number num11, the second number num22, the third number num12, and the fourth number num21 are all 1 and are equal.

Further, the parasitic capacitances C#A1$_{n-1}$, C#A2B2$_{n-1}$, C#B2A2$_{n-1}$ and C#B1$_{n-1}$ have (substantially) the same value for the same reason as illustrated in FIG. 8 or 10.

Figure 14:
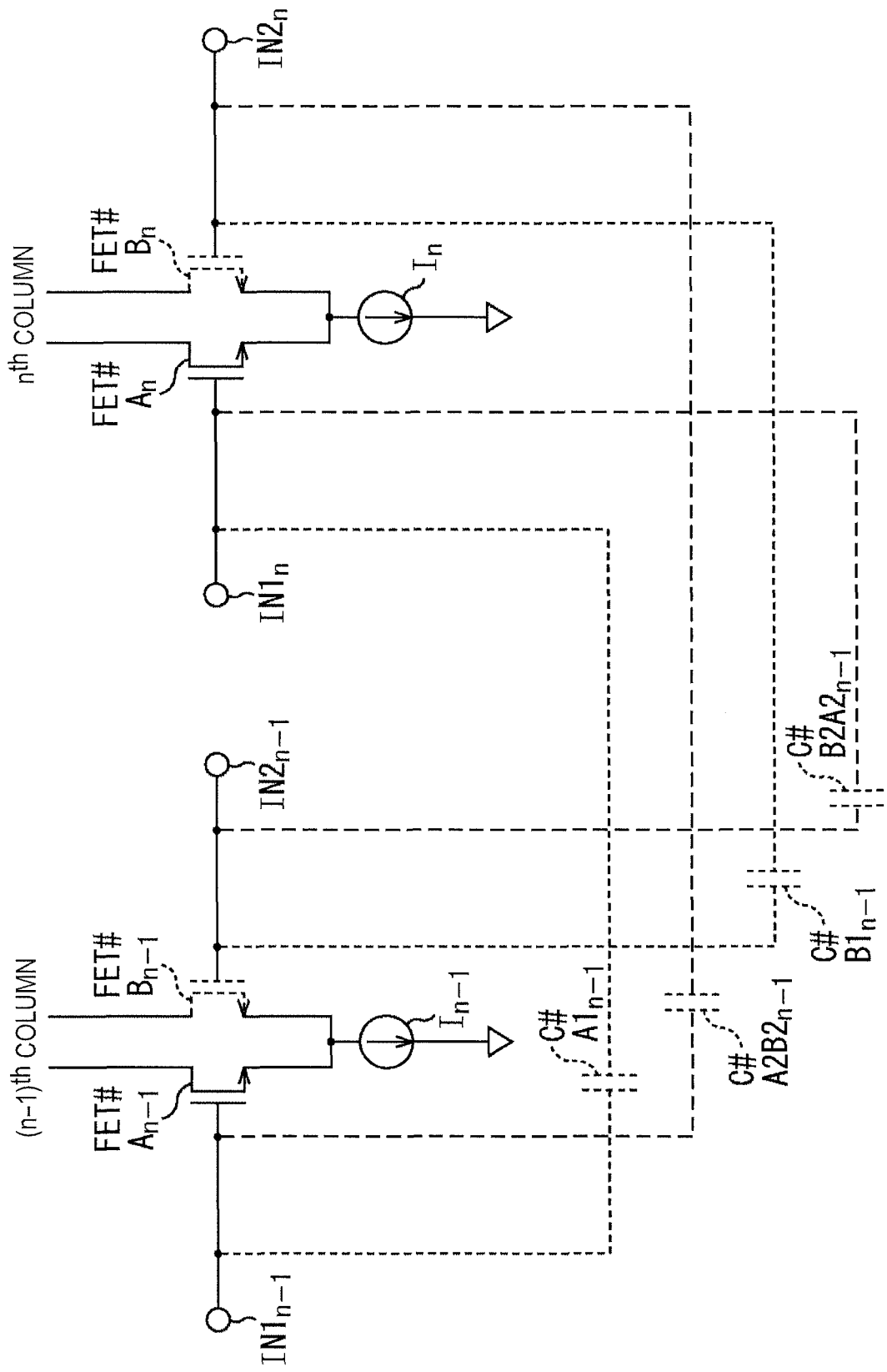
FIG. 14 is a circuit diagram illustrating a differential pair of a comparator $61_{n-1}$ in an $(n-1)^{th}$ column and a differential pair of a comparator $61_n$ in an $n^{th}$ column that are adjacent to each other, in which parasitic capacitances are created.

FIG. 14 is a circuit diagram illustrating the differential pair of the comparator 61$_{n-1}$ of the (n−1)$^{th}$ column and the differential pair of the comparator 61$_n$ of the n$^{th}$ column that are adjacent each other, in which parasitic capacitances are created as illustrated in FIG. 13.

Further, FIG. 14 is a circuit diagram illustrating FET#A$_n$ and FET#B$_n$ constituting the differential pair of the comparator 61$_n$ as they are without dividing FET#A$_n$ and FET#B$_n$, as in FIG. 12.

As illustrated in FIG. 14, the inversion input terminal IN1$_{n-1}$ (connected to the gate of FET#A$_{n-1}$) of the comparator 61$_{n-1}$ of the (n−1)$^{th}$ column and the inversion input terminal IN1$_n$ (connected to the gate of FET#A$_n$) of the comparator 61$_n$ of the n$^{th}$ column which are adjacent are connected by the parasitic capacitance C#A1$_{n-1}$.

Further, the non-inversion input terminal IN2$_{n-1}$ (connected to the gate of FET#B$_{n-1}$) of the comparator 61$_{n-1}$ of the (n−1)$^{th}$ column and the non-inversion input terminal IN2$_n$ (connected to the gate of FET#B$_n$) of the comparator 61$_n$ of the n$^{th}$ column which are adjacent are connected by the parasitic capacitance C#B1$_{n-1}$.

Further, the inversion input terminal IN1$_{n-1}$ (connected to the gate of FET#A$_{n-1}$) of the comparator 61$_{n-1}$ of the (n−1)$^{th}$ column and the non-inversion input terminal IN2$_n$ (connected to the gate of FET#B$_n$) of the comparator 61$_n$ of the n$^{th}$ column which are adjacent are connected by the parasitic capacitance C#A2B2$_{n-1}$.

Further, the non-inversion input terminal IN2$_{n-1}$ (connected to the gate of FET#B$_{n-1}$) of the comparator 61$_{n-1}$ of the (n−1)$^{th}$ column and the inversion input terminal IN1$_n$ (connected to the gate of FET#A$_n$) of the comparator 61$_n$ of the n$^{th}$ column which are adjacent are connected by the parasitic capacitance C#B2A2$_{n-1}$.

Accordingly, for example, when the voltage fluctuation caused by noise or the like occurs in the inversion input terminal IN1$_{n-1}$ of the comparator 61$_{n-1}$ of the (n−1)$^{th}$ column, the voltage fluctuation influences the inversion input terminal IN1$_n$ of the comparator 61$_n$ of the n$^{th}$ column adjacent to the (n−1)$^{th}$ column via the parasitic capacitance C#A1$_{n-1}$ and influences the non-inversion input terminal IN2$_n$ of the comparator 61$_n$ via the parasitic capacitance C#A2B2$_{n-1}$, and voltage fluctuations of the same degree occur in the inversion input terminal IN1$_n$ and the non-inversion input terminal IN2$_n$ of the comparator 61$_n$ of the n$^{th}$ column.

In the differential pair to which the inversion input terminal IN1$_n$ and the non-inversion input terminal IN2$_n$ are connected in the comparator 61$_n$ of the n$^{th}$ column, since the voltage fluctuations of the same degree occurring in both the inversion input terminal IN1$_n$ and the non-inversion input terminal IN2$_n$ are in-phase signals, the voltage fluctuations are canceled and do not influence the output of the comparator 61$_n$ of the n$^{th}$ column.

Further, for example, when the voltage fluctuation caused by noise or the like occurs in the non-inversion input terminal IN2$_{n-1}$ of the comparator 61$_{n-1}$ of the (n−1)$^{th}$ column, the voltage fluctuation influences the non-inversion input terminal IN2$_n$ of the comparator 61$_n$ of the n$^{th}$ column adjacent to the (n−1)$^{th}$ column via the parasitic capacitance C#B1$_{n-1}$ and influences the inversion input terminal IN1$_n$ of the comparator 61$_n$ via the parasitic capacitance C#B2A2$_{n-1}$, and voltage fluctuations of the same degree occur in the inversion input terminal IN1$_n$ and the non-inversion input terminal IN2$_n$ of the comparator 61$_n$ of the n$^{th}$ column.

In the differential pair to which the inversion input terminal $IN1_n$ and the non-inversion input terminal $IN2_n$ are connected in the comparator $61_n$ of the $n^{th}$ column, since the voltage fluctuations of the same degree occurring in both the inversion input terminal $IN1_n$ and the non-inversion input terminal $IN2_n$ are in-phase signals, the voltage fluctuations are canceled and do not influence the output of the comparator $61_n$ of the $n^{th}$ column.

As described above, the voltage fluctuation of the inversion input terminal $IN1_{n-1}$ or the non-inversion input terminal $IN2_{n-1}$ of the comparator $61_{n-1}$ of the $(n-1)^{th}$ column does not influence the output of the comparator $61_n$ of the adjacent $n^{th}$ column (and the comparator $61_n'$ of the other column) via the parasitic capacitances.

Accordingly, in the adjacent $(n-1)^{th}$ and $n^{th}$ columns, when FET#A1$_{n-1}$, FET#A2$_{n-1}$, FET#B1$_{n-1}$ and FET#B2$_{n-1}$ of the $(n-1)^{th}$ column and FET#A1$_n$, FET#A2$_n$, FET#B1$_n$ and FET#B2$_n$ of the $n^{th}$ column are arranged in the different arrangement patterns as illustrated in FIG. 13, it is possible to improve a crosstalk characteristic of the column parallel AD conversion unit 22, as in the case of FIG. 10.

Figure 15:
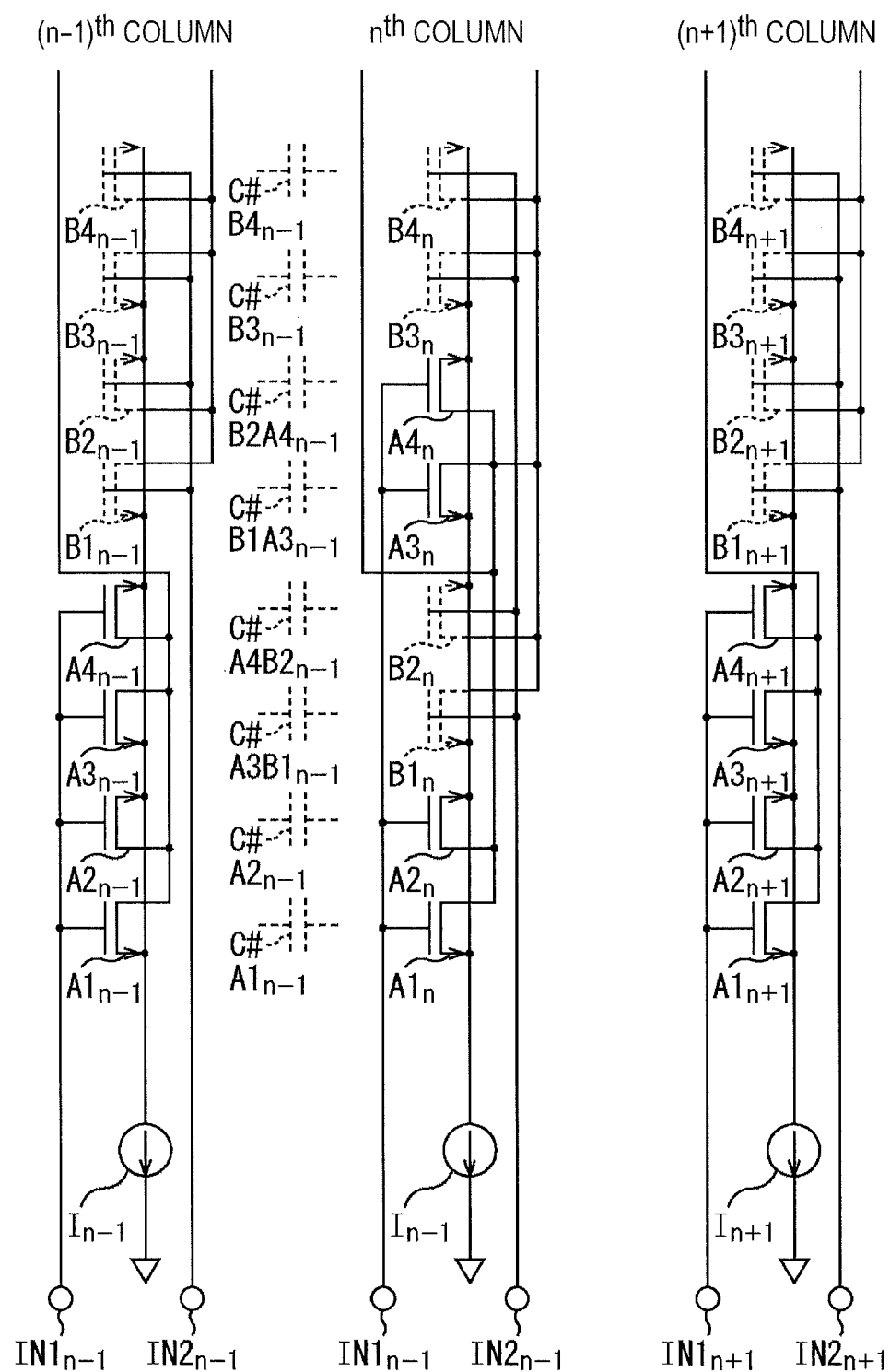
FIG. 15 is a diagram illustrating a third example of an arrangement of FET#$A_n$ and FET#$B_n$ improving a crosstalk characteristic.

FIG. 15 is a diagram illustrating a third example of the arrangement of FET#A$_n$ and FET#B$_n$ improving a crosstalk characteristic.

In FIG. 15, FET#A$_n$ and FET#B$_n$ are divided into FET#A1$_n$, FET#A2$_n$, FET#A3$_n$ and FET#A4$_n$ as four first division FETs and into FET#B1$_n$, FET#B2$_n$, FET#B3$_n$ and FET#B4$_n$ as four second division FETs, which have the same size.

Further, in FIG. 15, in the $(n-1)^{th}$ column, FET#A1$_{n-1}$ to FET#A4$_{n-1}$ and FET#B1$_{n-1}$ to FET#B4$_{n-1}$ are arranged in order of FET#A1$_{n-1}$, FET#A2$_{n-1}$, FET#A3$_{n-1}$, FET#A4$_{n-1}$, FET#B1$_{n-1}$, FET#B2$_{n-1}$, FET#B3$_{n-1}$ and FET#B4$_{n-1}$ from a bottom (the same applies to . . . , the $(n-5)^{th}$ column, the $(n-3)^{th}$ column, the $(n+1)^{th}$ column, the $(n+3)^{th}$ column, . . . ).

Further, in FIG. 15, in the $n^{th}$ column adjacent to the $(n-1)^{th}$ column, FET#A1$_n$ to FET#A4$_n$ and FET#B1$_n$ to FET#B4$_n$ are arranged in order of FET#A1$_n$, FET#A2$_n$, FET#B1$_n$, FET#B2$_n$, FET#A3$_n$, FET#A4$_n$, FET#B3$_n$ and FET#B4$_n$ from the bottom (the same applies to . . . , the $(n-4)^{th}$ column, the $(n-2)^{th}$ column, the $(n+2)^{th}$ column, the $(n+4)^{th}$ column, . . . ).

Accordingly, even in FIG. 15, an arrangement pattern of FET#A1$_{n-1}$ to FET#A4$_{n-1}$ and FET#B1$_{n-1}$ to FET#B4$_{n-1}$ of any $(n-1)^{th}$ column (an arrangement order of FET#A1$_{n-1}$ to FET#A4$_{n-1}$ and FET#B1$_{n-1}$ to FET#B4$_{n-1}$ arranged side by side in the column direction) and an arrangement pattern of FET#A1$_n$ to FET#A4$_n$ and FET#B1$_n$ to FET#B4$_n$ of the $n^{th}$ column (adjacent column) adjacent to the $(n-1)^{th}$ column are different from each other, as in FIGS. 10 and 13.

In FIG. 15, FET#A1$_{n-1}$ to FET#A4$_{n-1}$ as the first division FETs and FET#B1$_{n-1}$ to FET#B4$_{n-1}$ as the second division FETs in the $(n-1)^{th}$ column, and FET#A1$_n$ to FET#A4$_n$ as the first division FETs and FET#B1$_n$ to FET#B4$_n$ as the second division FETs in the $n^{th}$ column are arranged so that parasitic capacitance coupling between FET#A$_{n-1}$ as the first transistor in the $(n-1)^{th}$ column and each of FET#A$_n$ as the first transistor and FET#B$_n$ as the second transistor in the $n^{th}$ column adjacent to the $(n-1)^{th}$ column is created and parasitic capacitance coupling between FET#B$_{n-1}$ as the second transistor in the $(n-1)^{th}$ column and each of FET#A$_n$ as the first transistor and FET#B$_n$ as the second transistor in the $n^{th}$ column adjacent to the $(n-1)^{th}$ column is created, as in the case of FIG. 10 or 13.

Further, in FIG. 15, in the $(n-1)^{th}$ column and the $n^{th}$ column, FET#A1$_{n-1}$ to FET#A4$_{n-1}$ and FET#B1$_{n-1}$ to FET#B4$_{n-1}$ of the $(n-1)^{th}$ column and FET#A1$_n$ to FET#A4$_n$ and FET#B1$_n$ to FET#B4$_n$ of the $n^{th}$ column are arranged so that all of the first number num11 of the first division FET of the $(n-1)^{th}$ column and the first division FET of the $n^{th}$ column that face each other, the second number num22 of the second division FET of the $(n-1)^{th}$ column and second division FET of the $n^{th}$ column that face each other, the third number num12 of the first division FET of the $(n-1)^{th}$ column and the second division FET of the $n^{th}$ column that face each other, and the fourth number num21 of the second division FET of the $(n-1)^{th}$ column and the first division FET of the $n^{th}$ column that face each other are equal, as in the case of FIG. 10 or 13.

In other words, in FIG. 15, in the adjacent $(n-1)^{th}$ and $n^{th}$ columns, FET#A1$_{n-1}$ of the $(n-1)^{th}$ column and FET#A1$_n$ of the $n^{th}$ column face each other, and FET#A2$_{n-1}$ of the $(n-1)^{th}$ column and FET#A2$_n$ of the $n^{th}$ column face each other. Further, the parasitic capacitance C#A1$_{n-1}$ is created between FET#A1$_{n-1}$ of the $(n-1)^{th}$ column and FET#A1$_n$ of the $n^{th}$ column that face each other, and a parasitic capacitance C#A2$_{n-1}$ is created between FET#A2$_{n-1}$ of the $(n-1)^{th}$ column and FET#A2$_n$ of the $n^{th}$ column that face each other.

Further, in FIG. 15, in the adjacent $(n-1)^{th}$ and $n^{th}$ columns, FET#A3$_{n-1}$ of the $(n-1)^{th}$ column and FET#B1$_n$ of the $n^{th}$ column face each other, and FET#A4$_{n-1}$ of the $(n-1)^{th}$ column and FET#B2$_n$ of the $n^{th}$ column face each other. Further, a parasitic capacitance C#A3B1$_{n-1}$ is created between FET#A3$_{n-1}$ of the $(n-1)^{th}$ column and FET#B1$_n$ of the $n^{th}$ column that face each other, and a parasitic capacitance C#A4B2$_{n-1}$ is created between FET#A4$_{n-1}$ of the $(n-1)^{th}$ column and FET#B2$_n$ of the $n^{th}$ column that face each other.

Further, in FIG. 15, in the adjacent $(n-1)^{th}$ and $n^{th}$ columns, FET#B1$_{n-1}$ of the $(n-1)^{th}$ column and FET#A3$_n$ of the $n^{th}$ column face each other, and FET#B2$_{n-1}$ of the $(n-1)^{th}$ column and FET#A4$_n$ of the $n^{th}$ column face each other. Further, a parasitic capacitance C#B1A3$_{n-1}$ is created between FET#B1$_{n-1}$ of the $(n-1)^{th}$ column and FET#A3$_n$ of the $n^{th}$ column, and a parasitic capacitance C#B2A4$_{n-1}$ is created between FET#B2$_{n-1}$ of the $(n-1)^{th}$ column and FET#A4$_n$ of the $n^{th}$ column that face each other.

Further, in FIG. 15, in the adjacent $(n-1)^{th}$ and $n^{th}$ columns, FET#B3$_{n-1}$ of the $(n-1)^{th}$ column and FET#B3$_n$ of the $n^{th}$ column face each other, and FET#B4$_{n-1}$ of the $(n-1)^{th}$ column and FET#B4$_n$ of the $n^{th}$ column face each other. Further, a parasitic capacitance C#B3$_{n-1}$ is created between FET#B3$_{n-1}$ of the $(n-1)^{th}$ column and FET#B3$_n$ of the $n^{th}$ column that face each other, and a parasitic capacitance C#B4$_{n-1}$ is created between FET#B4$_{n-1}$ of the $(n-1)^{th}$ column and FET#B4$_n$ of the $n^{th}$ column that face each other.

Accordingly, in FIG. 15, in the $(n-1)^{th}$ column and the $n^{th}$ column, the first number num11 of the first division FETs of the $(n-1)^{th}$ column and the first division FETs of the $n^{th}$ column that face each other is 2: a set of FET#A1$_{n-1}$ of the $(n-1)^{th}$ column and FET#A1$_n$ of the $n^{th}$ column and a set of FET#A2$_{n-1}$ of the $(n-1)^{th}$ column and FET#A2$_n$ of the $n^{th}$ column.

Further, the second number num22 of the second division FETs of the $(n-1)^{th}$ column and second division FETs of the $n^{th}$ column that correspond to each other is 2: a set of FET#B3$_{n-1}$ of the $(n-1)^{th}$ column and FET#B3$_n$ of the $n^{th}$ column and a set of FET#B4$_{n-1}$ of the $(n-1)^{th}$ column and FET#B4$_n$ of the $n^{th}$ column.

Further, the third number num12 of the first division FET of the $(n-1)^{th}$ column and the second division FET of the $n^{th}$ column that face each other is 2: a set of FET#A3$_{n-1}$ of the $(n-1)^{th}$ column and FET#B1$_n$ of the $n^{th}$ column and a set of FET#A4$_{n-1}$ of the (n−1)$^{th}$ column and FET#B2$_n$ of the n$^{th}$ column, and the fourth number num21 of the second division FET of the (n−1)$^{th}$ column and the first division FET of the n$^{th}$ column that face each other is 2: a set of FET#B1$_{n-1}$ of the (n−1)$^{th}$ column and FET#A3$_n$ of the n$^{th}$ column and a set of FET#B2$_{n-1}$ of the (n−1)$^{th}$ column and FET#A4$_n$ of the n$^{th}$ column.

Accordingly, the first number num11, the second number num22, the third number num12, and the fourth number num21 are all equal and are 2.

Further, in the parasitic capacitances C#A1$_{n-1}$, C#A2$_{n-1}$, C#A3B1$_{n-1}$, C#A4B2$_{n-1}$, C#B1A3$_{n-1}$, C#B2A4$_{n-1}$, C#B3$_{n-1}$ and C#B4$_{n-1}$, have (substantially) the same value for the same reason as illustrated in FIG. 8 or 10.

Figure 16:
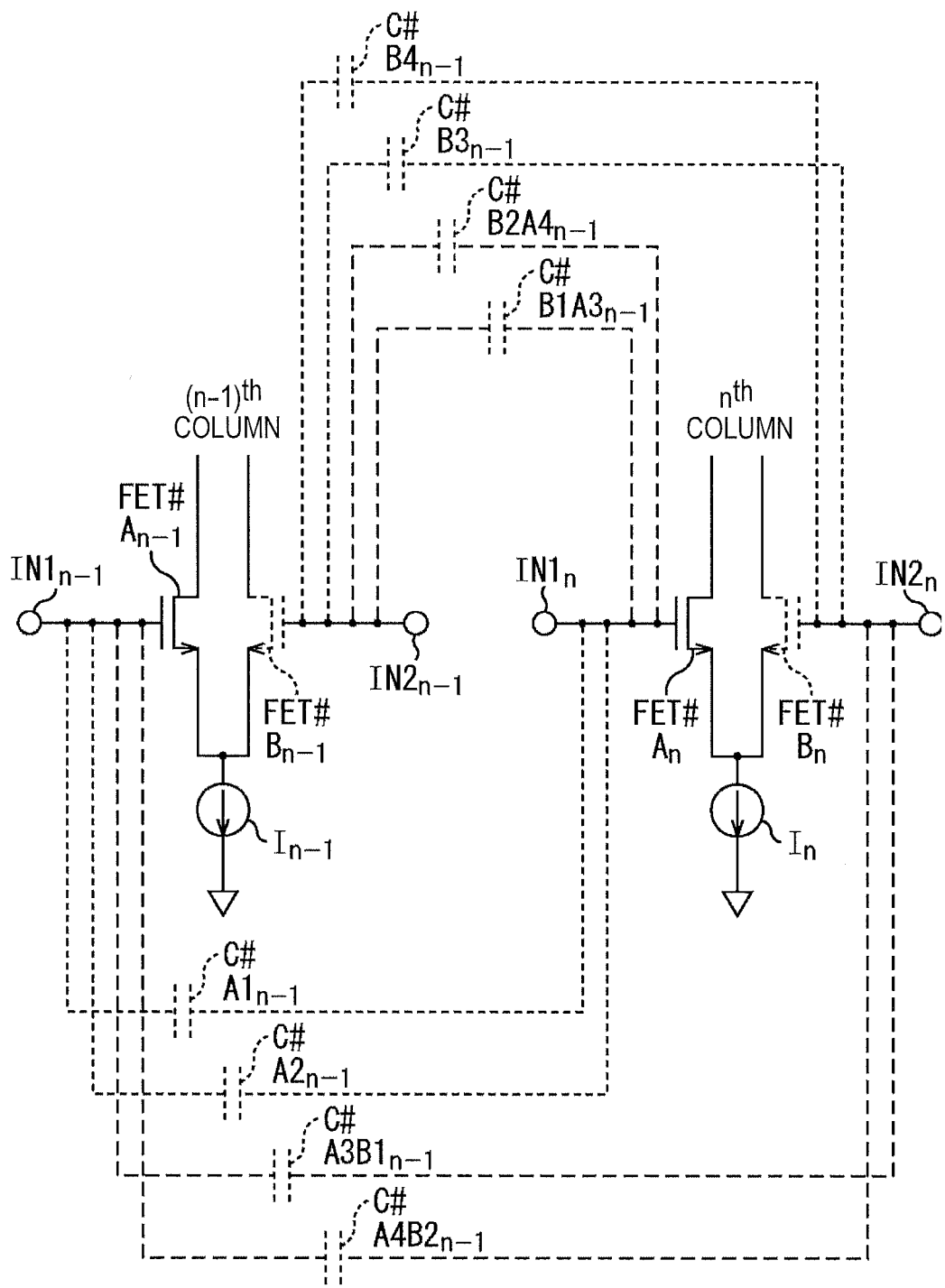
FIG. 16 is a circuit diagram illustrating a differential pair of a comparator $61_{n-1}$ in an $(n-1)^{th}$ column and a differential pair of a comparator $61_n$ in an $n^{th}$ column that are adjacent to each other, in which parasitic capacitances are created.

FIG. 16 is a circuit diagram illustrating the differential pair of the comparator 61$_{n-1}$ of the (n−1)$^{th}$ column and the differential pair of the comparator 61$_n$ of the n$^{th}$ column, which are adjacent, and in which parasitic capacitances are created as illustrated in FIG. 15.

Further, FIG. 16 is a circuit diagram illustrating FET#A$_n$ and FET#B$_n$ constituting the differential pair of the comparator 61$_n$ as they are without dividing FET#A$_n$ and FET#B$_n$, as in FIG. 12.

As illustrated in FIG. 16, the inversion input terminal IN1$_{n-1}$ of the comparator 61$_{n-1}$ of the (n−1)$^{th}$ column and the inversion input terminal IN1$_n$ of the comparator 61$_n$ of the n$^{th}$ column that are adjacent to each other are coupled by each of parasitic capacitances C#A1$_{n-1}$ and C#A2$_{n-1}$.

Further, the non-inversion input terminal IN2$_{n-1}$ of the comparator 61$_{n-1}$ of the (n−1)$^{th}$ column and the non-inversion input terminal IN2$_n$ of the comparator 61$_n$ of the n$^{th}$ column that are adjacent to each other are coupled by each of parasitic capacitances C#B3$_{n-1}$ and C#B4$_{n-1}$.

Furthermore, the inversion input terminal IN1$_{n-1}$ of the comparator 61$_{n-1}$ of the (n−1)$^{th}$ column and the non-inversion input terminal IN2$_n$ of the comparator 61$_n$ of the n$^{th}$ column that are adjacent to each other are coupled by each of parasitic capacitances C#A3B1$_{n-1}$ and C#A4B2$_{n-1}$.

Further, the non-inversion input terminal IN2$_{n-1}$ of the comparator 61$_{n-1}$ of the (n−1)$^{th}$ column and the inversion input terminal IN1$_n$ of the comparator 61$_n$ of the n$^{th}$ column that are adjacent to each other are coupled by each of parasitic capacitances C#B2A4$_{n-1}$ and C#B1A3$_{n-1}$.

Accordingly, for example, when voltage fluctuation caused by noise or the like occurs in the inversion input terminal IN1$_{n-1}$ of the comparator 61$_{n-1}$ of the (n−1)$^{th}$ column, the voltage fluctuation influences the inversion input terminal IN1$_n$ of the comparator 61$_n$ of the n$^{th}$ column adjacent to the (n−1)$^{th}$ column via each of the parasitic capacitances C#A1$_{n-1}$ and C#A2$_{n-1}$ and influences the non-inversion input terminal IN2$_n$ of the comparator 61$_n$ of the n$^{th}$ column adjacent to the (n−1)$^{th}$ column via each of the parasitic capacitances C#A3B1$_{n-1}$ and C#A4B2$_{n-1}$, and voltage fluctuations of the same degree occur in the inversion input terminal IN1$_n$ and the non-inversion input terminal IN2$_n$ of the comparator 61$_n$ of the n$^{th}$ column.

Further, for example, when voltage fluctuation caused by noise or the like occurs in the non-inversion input terminal IN2$_{n-1}$ of the comparator 61$_{n-1}$ of the (n−1)$^{th}$ column, the voltage fluctuation influences the non-inversion input terminal IN2$_n$ of the comparator 61$_n$ of the n$^{th}$ column adjacent to the (n−1)$^{th}$ column via each of the parasitic capacitances C#B3$_{n-1}$ and C#B4$_{n-1}$ and influences the inversion input terminal IN1$_n$ of the comparator 61$_n$ of the n$^{th}$ column adjacent to the (n−1)$^{th}$ column via each of the parasitic capacitances C#B2A4$_{n-1}$ and C#B1A3$_{n-1}$, and voltage fluctuations of the same degree occur in the inversion input terminal IN1$_n$ and the non-inversion input terminal IN2$_n$ of the comparator 61$_n$ of the n$^{th}$ column.

In the comparator 61$_n$ of the n$^{th}$ column, since the voltage fluctuations of the same degree occurring in both the inversion input terminal IN1$_n$ and the non-inversion input terminal IN2$_n$ in the differential pair to which the inversion input terminal IN1$_n$ and the non-inversion input terminal IN2$_n$ are connected are in-phase signals, the voltage fluctuations are canceled and do not influence the output of the comparator 61$_n$ of the n$^{th}$ column.

As described above, the voltage fluctuation of the inversion input terminal IN1$_{n-1}$ or the non-inversion input terminal IN2$_{n-1}$ of the comparator 61$_{n-1}$ of the (n−1)$^{th}$ column does not influence the output of the comparator 61$_n$ of the adjacent n$^{th}$ column (and the comparator 61$_n$' of the other column) via the parasitic capacitances. Accordingly, in the adjacent (n−1)$^{th}$ and n$^{th}$ columns, when FET#A1$_{n-1}$ to FET#A4$_{n-1}$ and FET#B1$_{n-1}$ to FET#B4$_{n-1}$ of the (n−1)$^{th}$ column and FET#A1$_n$ to FET#A4$_n$ and FET#B1$_n$ to FET#B4$_n$ of the n$^{th}$ column are arranged in the different arrangement patterns illustrated in FIG. 15, it is possible to improve a crosstalk characteristic of the column parallel AD conversion unit 22, as in the case of FIG. 10.

Here, in the adjacent (n−1)$^{th}$ and n$^{th}$ columns, the first division FET and the second division FET of the (n−1)$^{th}$ column and the first division FET and the second division FET of the n$^{th}$ column are arranged so that all of the first number num11 of the first division FET of the (n−1)$^{th}$ column and the first division FET of the n$^{th}$ column that face each other, the second number num22 of the second division FET of the (n−1)$^{th}$ column and the second division FET of the n$^{th}$ column that correspond to each other, the third number num12 of the first division FET of the (n−1)$^{th}$ column and the second division FET of the n$^{th}$ column that face each other, and the fourth number num21 of the second division FET of the (n−1)$^{th}$ column and the first division FET of the n$^{th}$ column that face each other are equal, as illustrated in FIGS. 10 to 16, and accordingly, for example, even when voltage fluctuation occurs in the inversion input terminal IN1$_{n-1}$ and the non-inversion input terminal IN2$_{n-1}$ of the comparator 61$_{n-1}$ of the (n−1)$^{th}$ column, this voltage fluctuation causes voltage fluctuations of the same degree in both the inversion input terminal IN1$_n$ and the non-inversion input terminal IN2$_n$ of the comparator 61$_n$ in the n$^{th}$ column adjacent to the (n−1)$^{th}$ column via each of the plurality of the same parasitic capacitances.

Further, in the differential pair of the comparator 61$_n$ of the n$^{th}$ column, the voltage fluctuations of the same degree occurring in both the inversion input terminal IN1$_n$ and the non-inversion input terminal IN2$_n$ are canceled, and as a result, the voltage fluctuations occurring in the inversion input terminal IN1$_{n-1}$ and the non-inversion input terminal IN2$_{n-1}$ of the comparator 61$_{n-1}$ of the (n−1)$^{th}$ column do not influence the output of the comparator 61$_n$ of the n$^{th}$ column, thereby improving a crosstalk characteristic of the column parallel AD conversion unit 22.

As described above, it is necessary for the first number num11 to the fourth number num4 for the first division FETs and the second division FETs arranged in the adjacent (n−1)$^{th}$ and n$^{th}$ columns to match (equal) in order for the voltage fluctuations occurring in the inversion input terminal IN1$_{n-1}$ and the non-inversion input terminal IN2$_{n-1}$ of the comparator 61$_{n-1}$ of the (n−1)$^{th}$ column to be canceled as the voltage fluctuations of the same degree occurring in both the inversion input terminal IN1$_n$ and the non-inversion input terminal $IN2_n$ of the comparator $61_n$ in the differential pair of the comparator $61_n$ of the $n^{th}$ column adjacent to the $(n-1)^{th}$ column.

Further, it is necessary to divide each of $FET\#A_n$ and $FET\#B_n$ constituting the differential pair in (the same) even numbers to cause the first number num11 to the fourth number num4 to match.

However, even when each of $FET\#A_n$ and $FET\#B_n$ constituting the differential pair is divided in an odd number, it is possible to improve a crosstalk characteristic of the column parallel AD conversion unit 22 by arranging the first division FETs into which $FET\#A_{n-1}$ has been divided and the second division FETs into which $FET\#B_{n-1}$ has been divided, which constitute the differential pair in the $(n-1)^{th}$ column, and the first division FETs into which $FET\#A_n$ has been divided and the second division FETs into which $FET\#B_n$ has been divided, which constitute the differential pair in the $n^{th}$ column adjacent to the $(n-1)^{th}$ column, in the different arrangement patterns, so that the first number num11 to the fourth number num4 match if possible, in comparison with the case in which the arrangement in the same arrangement patterns as illustrated in FIG. 8 is performed.

Figure 17:
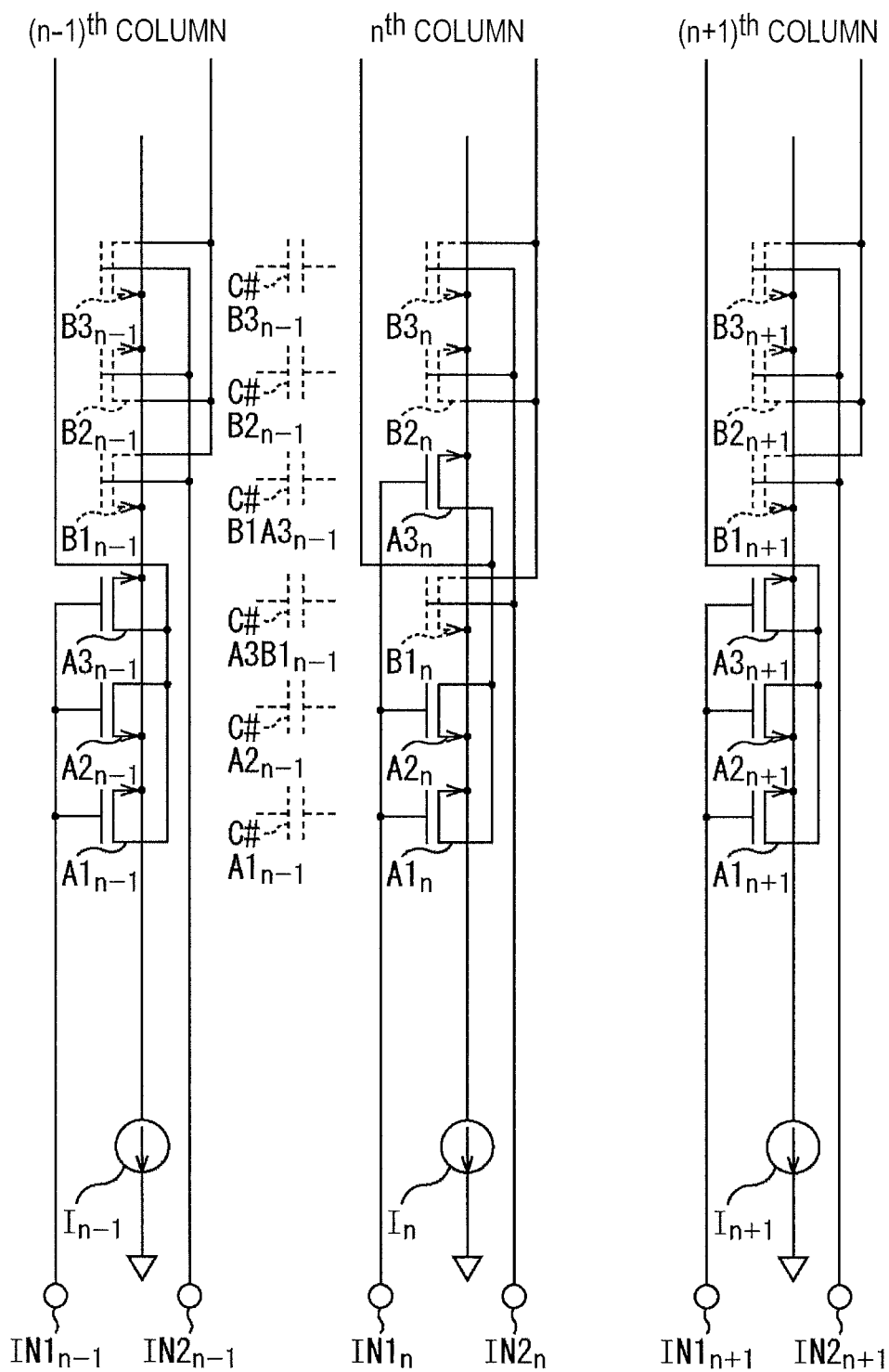
FIG. 17 is a diagram illustrating a fourth example of an arrangement of FET#$A_n$ and FET#$B_n$ improving a crosstalk characteristic.

FIG. 17 is a diagram illustrating a fourth example of the arrangement of $FET\#A_n$ and $FET\#B_n$ improving the crosstalk characteristic.

In FIG. 17, $FET\#A_n$ and $FET\#B_n$ are divided into $FET\#A1_n$, $FET\#A2_n$ and $FET\#A3_n$ as an odd number of, i.e., three, first division FETs having the same size and $FET\#B1_n$, $FET\#B2_n$ and $FET\#B3_n$ as an odd number of, i.e., three, second division FETs having the same size.

Further, in FIG. 17, $FET\#A1_{n-1}$ to $FET\#A3_{n-1}$ and $FET\#B1_{n-1}$ to $FET\#B3_{n-1}$ are arranged in order of $FET\#A1_{n-1}$, $FET\#A2_{n-1}$, $FET\#A3_{n-1}$, $FET\#B1_{n-1}$, $FET\#B2_{n-1}$ and $FET\#B3_{n-1}$ from a bottom in the $(n-1)^{th}$ column (the same applies to ..., the $(n-5)^{th}$ column, the $(n-3)^{th}$ column, the $(n+1)^{th}$ column, the $(n+3)^{th}$ column, ...).

Further, in FIG. 17, $FET\#A1_n$ to $FET\#A3_n$ and $FET\#B1_n$ to $FET\#B3_n$ are arranged in order of $FET\#A1_n$, $FET\#A2_n$, $FET\#B1_n$, $FET\#A3_n$, $FET\#B2_n$ and $FET\#B3_n$ from a bottom in the $n^{th}$ column adjacent to the $(n-1)^{th}$ column (the same applies to ..., the $(n-4)^{th}$ column, the $(n-2)^{th}$ column, the $(n+2)^{th}$ column, the $(n+4)^{th}$ column, ...).

Accordingly, in FIG. 17, an arrangement pattern of $FET\#A1_{n-1}$ to $FET\#A3_{n-1}$ and $FET\#B1_{n-1}$ to $FET\#B3_{n-1}$ of any $(n-1)^{th}$ column is different from the arrangement pattern of $FET\#A1_n$ to $FET\#A3_n$ and $FET\#B1_n$ to $FET\#B3_n$ of the $n^{th}$ column (adjacent column) adjacent to the $(n-1)^{th}$ column, as in FIG. 10, 13 or 15.

Further, in FIG. 17, $FET\#A1_{n-1}$ to $FET\#A3_{n-1}$ as first division FETs and $FET\#B1_{n-1}$ to $FET\#B3_{n-1}$ as the second division FETs of the $(n-1)^{th}$ column and $FET\#A1_n$ to $FET\#A3_n$ as the first division FETs and $FET\#B1_n$ to $FET\#B3_n$ as the second division FETs of the $n^{th}$ column are arranged so that parasitic capacitance coupling between $FET\#A_{n-1}$ as the first transistor of the $(n-1)^{th}$ column and each of $FET\#A_n$ as the first transistor and $FET\#B_n$ as the second transistor of the $n^{th}$ column adjacent to the $(n-1)^{th}$ column is created and parasitic capacitance coupling between $FET\#B_{n-1}$ as the second transistor of the $(n-1)^{th}$ column and each of $FET\#A_n$ as the first transistor and $FET\#B_n$ as the second transistor of the $n^{th}$ column (adjacent column) adjacent to the $(n-1)^{th}$ column is created, as in the case of FIG. 10, 13 or 15.

However, in FIG. 17, since each of $FET\#A_n$ and $FET\#B_n$ is divided in an odd number, i.e., three, the first number num11 of the first division FET of the $(n-1)^{th}$ column and the first division FET of the $n^{th}$ column that face each other, the second number num22 of the second division FET in the $(n-1)^{th}$ column and the second division FET in the $n^{th}$ column that face each other, the third number num12 of the first division FET in the $(n-1)^{th}$ column and the second division FET in the $n^{th}$ column that face each other, and the fourth number num21 of the second division FET in the $(n-1)^{th}$ column and the first division FET in the $n^{th}$ column that face each other do not completely match in the $(n-1)^{th}$ column and the $n^{th}$ column. Accordingly, in FIG. 17, $FET\#A1_{n-1}$ to $FET\#A3_{n-1}$ and $FET\#B1_{n-1}$ to $FET\#B3_{n-1}$ of the $(n-1)^{th}$ column and $FET\#A1_n$ to $FET\#A3_n$ and $FET\#B1_n$ to $FET\#B3_n$ of the $n^{th}$ column are arranged so that the first number num11, the second number num22, the third number num12 and the fourth number num21 match if possible.

In other words, in FIG. 17, in the adjacent $(n-1)^{th}$ and $n^{th}$ columns, $FET\#A1_{n-1}$ of the $(n-1)^{th}$ column and $FET\#A1_n$ of the $n^{th}$ column face each other, and $FET\#A2_{n-1}$ of the $(n-1)^{th}$ column and $FET\#A2_n$ of the $n^{th}$ column face each other. Further, a parasitic capacitance $C\#A1_{n-1}$ is created between $FET\#A1_{n-1}$ of the $(n-1)^{th}$ column and $FET\#A1_n$ of the $n^{th}$ column that face each other, and a parasitic capacitance $C\#A2_{n-1}$ is created between $FET\#A2_{n-1}$ of the $(n-1)^{th}$ column and $FET\#A2_n$ of the $n^{th}$ column that face each other.

Further, in FIG. 17, in the adjacent $(n-1)^{th}$ and $n^{th}$ columns, $FET\#A3_{n-1}$ of the $(n-1)^{th}$ column and $FET\#B1_n$ of the $n^{th}$ column face each other, and $FET\#B1_{n-1}$ of the $(n-1)^{th}$ column and $FET\#A3_n$ of the $n^{th}$ column face each other. Further, a parasitic capacitance $C\#A3B1_{n-1}$ is created between $FET\#A3_{n-1}$ of the $(n-1)^{th}$ column and $FET\#B1_n$ of the $n^{th}$ column that face each other, and a parasitic capacitance $C\#B1A3_{n-1}$ is created between $FET\#B1_{n-1}$ of the $(n-1)^{th}$ column and $FET\#A3_n$ of the $n^{th}$ column.

Further, in FIG. 17, in the adjacent $(n-1)^{th}$ and $n^{th}$ columns, $FET\#B2_{n-1}$ of the $(n-1)^{th}$ column and $FET\#B2_n$ of the $n^{th}$ column face each other, and $FET\#B3_{n-1}$ of the $(n-1)^{th}$ column and $FET\#B3_n$ of the $n^{th}$ column face each other. Further, a parasitic capacitance $C\#B2_{n-1}$ is created between $FET\#B2_{n-1}$ of the $(n-1)^{th}$ column and $FET\#B2_n$ of the $n^{th}$ column that face each other, and a parasitic capacitance $C\#B3_{n-1}$ is created between $FET\#B3_{n-1}$ of the $(n-1)^{th}$ column and $FET\#B3_n$ of the $n^{th}$ column that face each other.

Accordingly, in FIG. 17, in the $(n-1)^{th}$ column and the $n^{th}$ column, the first number num11 of the first division FETs of the $(n-1)^{th}$ column and the first division FETs of the $n^{th}$ column that face each other is 2: a set of $FET\#A1_{n-1}$ of the $(n-1)^{th}$ column and $FET\#A1_n$ of the $n^{th}$ column and a set of $FET\#A2_{n-1}$ of the $(n-1)^{th}$ column and $FET\#A2_n$ of the $n^{th}$ column.

Further, the second number num22 of the second division FETs of the $(n-1)^{th}$ column and the second division FETs of the $n^{th}$ column that correspond to each other is 2: a set of $FET\#B2_{n-1}$ of the $(n-1)^{th}$ column and $FET\#B2_n$ of the $n^{th}$ column and a set of $FET\#B3_{n-1}$ of the $(n-1)^{th}$ column and $FET\#B3_n$ of the $n^{th}$ column.

Further, the third number num12 of the first division FET of the $(n-1)^{th}$ column and the second division FET of the $n^{th}$ column that face each other is 1, i.e., a set of $FET\#A3_{n-1}$ of the $(n-1)^{th}$ column and $FET\#B1_n$ of the $n^{th}$ column, and the fourth number num21 of the second division FET of the $(n-1)^{th}$ column and the first division FET of the $n^{th}$ column that face each other is 1, i.e., a set of $FET\#B1_{n-1}$ of the $(n-1)^{th}$ column and $FET\#A3_n$ of the $n^{th}$ column.

Accordingly, the first number num11, the second number num22, the third number num12 and the fourth number num21 have a difference of at most 1, and have a matching value, if possible.

Further, the parasitic capacitances $C\#A1_{n-1}$, $C\#A2_{n-1}$, $C\#A3B1_{n-1}$, $C\#B1A3_{n-1}$, $C\#B2_{n-1}$ and $C\#B3_{n-1}$ have (substantially) the same values for the same reason as described with reference to FIG. 8 or 10.

Figure 18:
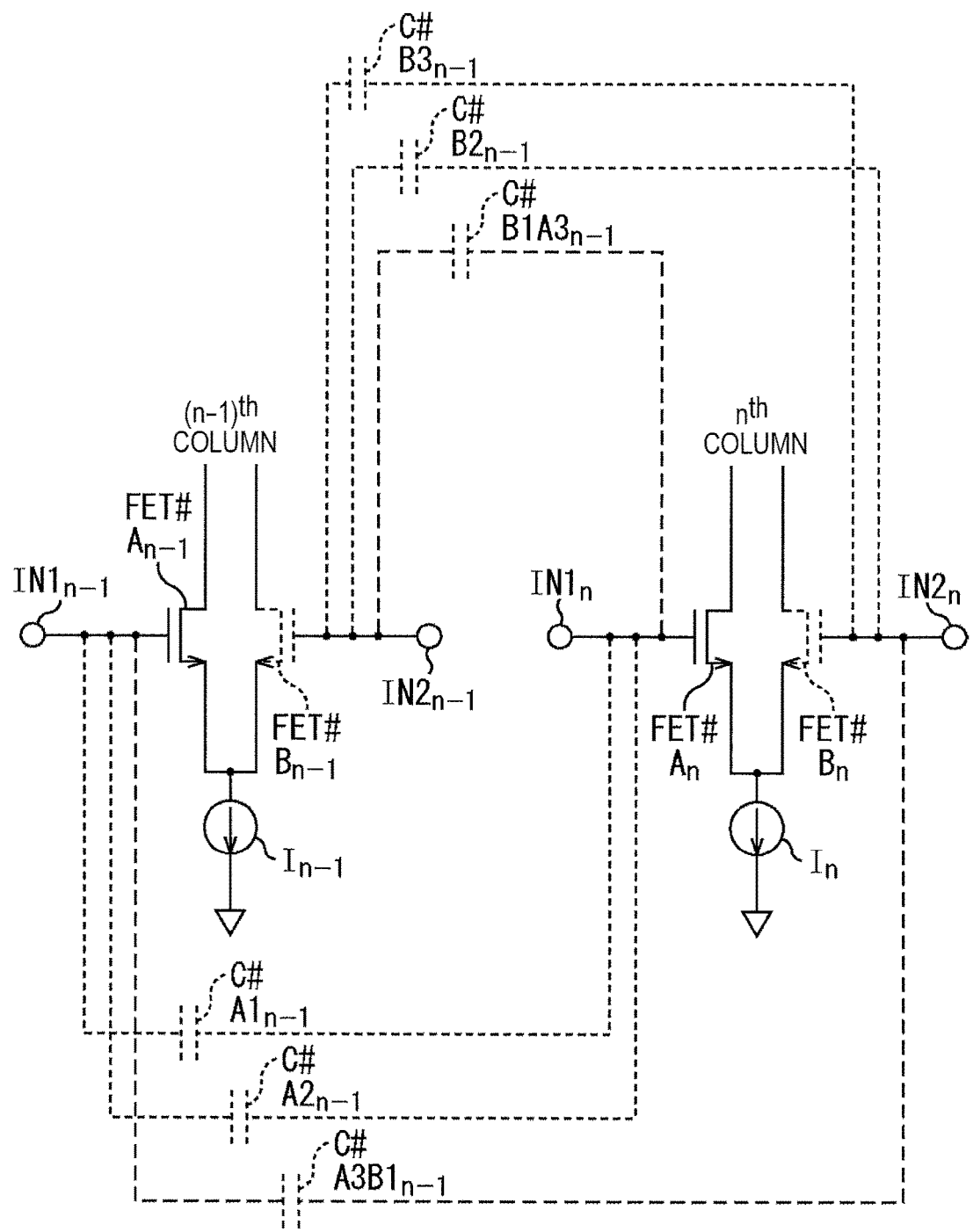
FIG. 18 is a circuit diagram illustrating a differential pair of a comparator $61_{n-1}$ in an $(n-1)^{th}$ column and a differential pair of a comparator $61_n$ in an $n^{th}$ column that are adjacent to each other, in which parasitic capacitances are created.

FIG. 18 is a circuit diagram illustrating the differential pair of the comparator $61_{n-1}$ of the $(n-1)^{th}$ column and the differential pair of the comparator $61_n$ of the $n^{th}$ column that are adjacent to each other, in which parasitic capacitances are created as illustrated in FIG. 17.

Further, FIG. 18 is a circuit diagram illustrating $FET\#A_n$ and $FET\#B_n$ constituting the differential pair of the comparator $61_n$ as they are without dividing $FET\#A_n$ and $FET\#B_n$, as in FIG. 12 or 16.

As illustrated in FIG. 18, the inversion input terminal $IN1_{n-1}$ of the comparator $61_{n-1}$ of the $(n-1)^{th}$ column and the inversion input terminal $IN1_n$ of the comparator $61_n$ of the $n^{th}$ column that are adjacent to each other are coupled by respective parasitic capacitances $C\#A1_{n-1}$ and $C\#A2_{n-1}$.

Further, the non-inversion input terminal $IN2_{n-1}$ of the comparator $61_{n-1}$ of the $(n-1)^{th}$ column and the non-inversion input terminal $IN2_n$ of the comparator $61_n$ of the $n^{th}$ column that are adjacent to each other are coupled by respective parasitic capacitances $C\#B2_{n-1}$ and $C\#B3_{n-1}$.

Further, the inversion input terminal $IN1_{n-1}$ of the comparator $61_{n-1}$ of the $(n-1)^{th}$ column and the non-inversion input terminal $IN2_n$ of the comparator $61_n$ of the $n^{th}$ column that are adjacent to each other are coupled by a parasitic capacitance $C\#A3B1_{n-1}$.

Further, the non-inversion input terminal $IN2_{n-1}$ of the comparator $61_{n-1}$ of the $(n-1)^{th}$ column and the inversion input terminal $IN1_n$ of the comparator $61_n$ of the $n^{th}$ column that are adjacent to each other are coupled by a parasitic capacitance $C\#B1A3_{n-1}$.

Accordingly, for example, when voltage fluctuation caused by noise or the like occurs in the inversion input terminal $IN1_{n-1}$ of the comparator $61_{n-1}$ of the $(n-1)^{th}$ column, the voltage fluctuation influences the inversion input terminal $IN1_n$ of the comparator $61_n$ of the $n^{th}$ column adjacent to the $(n-1)^{th}$ column via the respective two parasitic capacitances $C\#A1_{n-1}$ and $C\#A2_{n-1}$ and influences the non-inversion input terminal $IN2_n$ of the comparator $61_n$ of the $n^{th}$ column adjacent to the $(n-1)^{th}$ column via the one parasitic capacitance $C\#A3B1_{n-1}$, and voltage fluctuation occurs in the inversion input terminal $IN1_n$ and the non-inversion input terminal $IN2_n$ of the comparator $61_n$ of the $n^{th}$ column.

A degree of the occurring voltage fluctuation is different between the inversion input terminal $IN1_n$ influenced by the voltage fluctuation of the inversion input terminal $IN1_{n-1}$ via each of the two parasitic capacitances $C\#A1_{n-1}$ and $C\#A2_{n-1}$ and the non-inversion input terminal $IN2_n$ influenced by the voltage fluctuation of the inversion input terminal $IN1_{n-1}$ via the one parasitic capacitance $C\#A3B1_{n-1}$, but nevertheless, in the differential pair of the comparator $61_n$ of the $n^{th}$ column, a part (in-phase component) of the voltage fluctuation occurring in one of the inversion input terminal $IN1_n$ and the non-inversion input terminal $IN2_n$ is canceled by the voltage fluctuation occurring in the other.

Further, for example, when the voltage fluctuation caused by noise or the like occurs in the non-inversion input terminal $IN2_{n-1}$ of the comparator $61_{n-1}$ of the $(n-1)^{th}$ column, the voltage fluctuation influences the non-inversion input terminal $IN2_n$ of the comparator $61_n$ of the $n^{th}$ column adjacent to the $(n-1)^{th}$ column via the two parasitic capacitances $C\#B2_{n-1}$ and $C\#B3_{n-1}$ and influences the inversion input terminal $IN1_n$ of the comparator $61_n$ of the $n^{th}$ column adjacent to the $(n-1)^{th}$ column via the one parasitic capacitance $C\#B1A3_{n-1}$, and voltage fluctuation occurs in the inversion input terminal $IN1_n$ and the non-inversion input terminal $IN2_n$ of the comparator $61_n$ of the $n^{th}$ column.

A degree of the occurring voltage fluctuation is different between the non-inversion input terminal $IN2_n$ influenced by the voltage fluctuation of the non-inversion input terminal $IN2_{n-1}$ via each of the two parasitic capacitances $C\#B2_{n-1}$ and $C\#B3_{n-1}$ and the inversion input terminal $IN1_n$ influenced by the voltage fluctuation of the non-inversion input terminal $IN2_{n-1}$ via the one parasitic capacitance $C\#B1A3_{n-1}$, but nevertheless, in the differential pair of the comparator $61_n$ of the $n^{th}$ column, a part of the voltage fluctuation occurring in one of the inversion input terminal $IN1_n$ and the non-inversion input terminal $IN2_n$ is canceled by the voltage fluctuation occurring in the other.

As described above, when each of $FET\#A_n$ and $FET\#B_n$ constituting the differential pair is divided in an odd number, degrees of the voltage fluctuations in the inversion input terminal $IN1_n$ and the non-inversion input terminal $IN2_n$ of the differential pair of the $n^{th}$ column adjacent to the $(n-1)^{th}$ column caused by the voltage fluctuation of the inversion input terminal $IN1_{n-1}$ and the non-inversion input terminal $IN2_{n-1}$ of the differential pair of the $(n-1)^{th}$ column via the parasitic capacitances is different, but nevertheless, in the differential pair of the comparator $61_n$ of the $n^{th}$ column, a part of the voltage fluctuation occurring in one of the inversion input terminal $IN1_n$ and the non-inversion input terminal $IN2_n$ is canceled by the voltage fluctuation occurring in the other.

Accordingly, even when each of $FET\#A_n$ and $FET\#B_n$ constituting the differential pair is divided in odd numbers, it is possible to improve a crosstalk characteristic of the column parallel AD conversion unit 22 by arranging the first division FETs into which $FET\#A_{n-1}$ has been divided and the second division FETs into which $FET\#B_{n-1}$ has been divided, which constitute the differential pair in the $(n-1)^{th}$ column, and the first division FETs into which $FET\#A_n$ has been divided and the second division FETs into which $FET\#B_n$ has been divided, which constitute the differential pair in the $n^{th}$ column adjacent to the $(n-1)^{th}$ column, in the different arrangement patterns, so that the first number num11 to the fourth number num4 match if possible, in comparison with the case in which the arrangement in the same arrangement patterns as illustrated in FIG. 8 is performed.

[Configuration Example when the Image Sensor 2 is Formed as a Semiconductor Chip]

Figure 19:
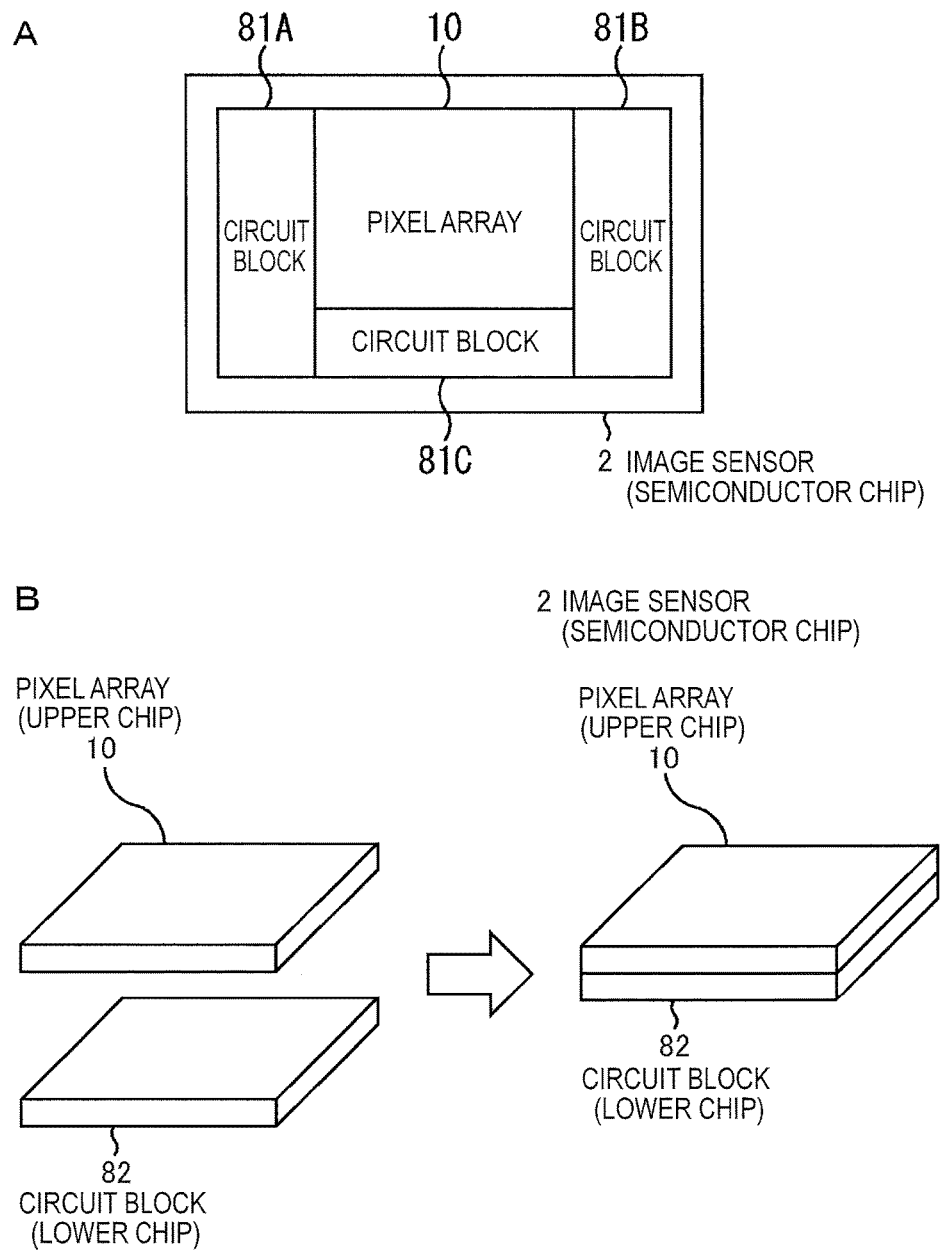
FIG. 19 is an overview diagram illustrating a configuration example when the image sensor 2 is configured as a semiconductor chip.

FIG. 19 is an overview diagram illustrating a configuration example when the image sensor 2 of FIG. 2 is formed as a semiconductor chip.

In other words, FIG. 19A is a plan view illustrating a configuration example when the image sensor 2 is configured using one bare chip, and FIG. 19B is a perspective diagram illustrating a configuration example when the image sensor 2 is configured using two bare chips stacked vertically.

When the image sensor 2 is configured using one bare chip, for example, a pixel array 10 may be formed on one bare chip, and circuit blocks 81A, 81B and 81C in which the pixel driving unit 21, the column parallel AD conversion unit 22, the output unit 23, and circuits other than the pixel array 10 are included around the pixel array 10 are formed, as illustrated in FIG. 19A.

When the image sensor 2 is formed as a stack type image sensor using two bare chips stacked vertically, for example, the pixel array 10 may be formed in the upper chip stacked on an upper side of the two bare chips, and a circuit block 82 in which the pixel driving unit 21, the column parallel AD conversion unit 22, the output unit 23, and circuits other than the pixel array 10 are included may be formed in the lower chip stacked on a lower side, as illustrated in FIG. 19B.

When the image sensor 2 is configured as the stack type image sensor as illustrated in FIG. 19B, in other words, when the image sensor 2 is configured using the upper chip in which the pixel array 10 is formed and the lower chip in which the circuit block 82 is formed as the two bare chips stacked vertically, it may be necessary to form the lower chip to have the same size as the upper chip.

The upper chip, in which the pixel array 10 is formed, may be formed to have the same size as the pixel array 10 formed on the one bare chip of FIG. 19A. When the lower chip is formed to have the same size as the upper chip, it is necessary to form all of the circuits included in the circuit blocks 81A to 83C of FIG. 19A as the circuit block 82 in the lower chip formed to have the same size as the upper chip.

Accordingly, it is necessary to further miniaturize the circuit of the column parallel AD conversion unit 22 or the like included in the circuit block 82. For example, for the column parallel AD conversion unit 22, it is necessary to make a distance between adjacent columns (a column pitch) shorter than that in the case in which the image sensor 2 is configured using one bare chip, which is illustrated in FIG. 19A.

In such a case, when the first division FETs into which FET#A$_{n-1}$ has been divided and the second division FETs into which FET#B$_{n-1}$ has been divided, which constitute the differential pair of the $(n-1)^{th}$ column, and the first division FETs into which FET#A$_n$ has been divided and the second division FETs into which FET#B$_n$ has been divided, which constitute the differential pair of the $n^{th}$ column adjacent to the $(n-1)^{th}$ column, are arranged in the same arrangement pattern as illustrated in FIG. 8, the crosstalk characteristic of the column parallel AD conversion unit 22 greatly deteriorates.

According to the present technology, the crosstalk characteristic can be improved without a side effect. The present technology is particularly useful, for example, when the column pitch is short as illustrated in FIG. 19B.

[Method of Manufacturing the Image Sensor 2]

Figure 20:
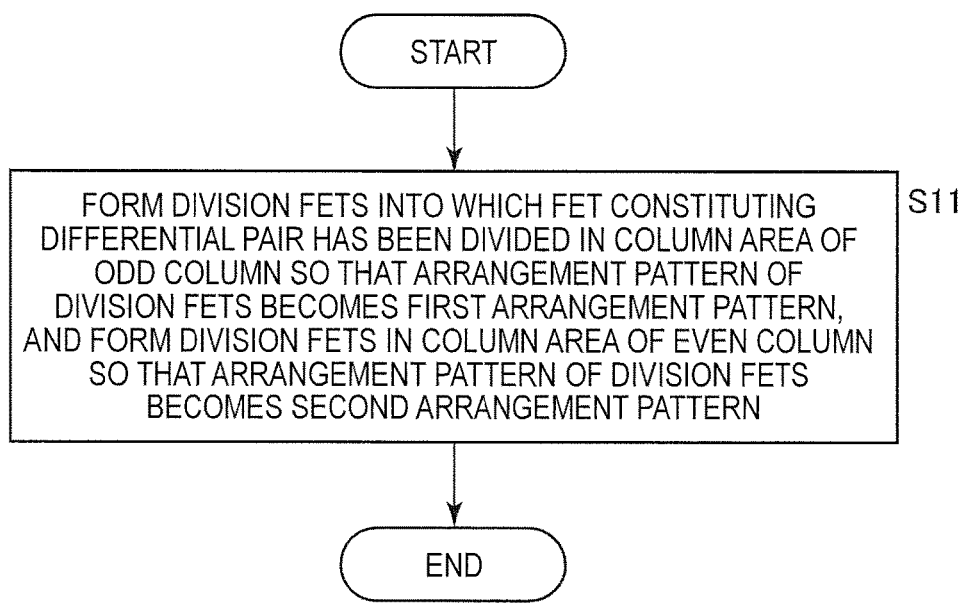
FIG. 20 is a flowchart illustrating a method of manufacturing a semiconductor chip as the image sensor 2.

FIG. 20 is a flowchart illustrating a method of manufacturing a semiconductor chip as the image sensor 2, and particularly, a method of manufacturing the column parallel AD conversion unit 22.

In step S11, in the column parallel AD conversion unit 22, the first division FETs into which FET#A constituting the differential pair has been divided and the second division FETs into which FET#B has been divided in the column area of an odd column are formed on a bare chip so that an arrangement pattern of the division FETs becomes a first arrangement pattern, and the first division FETs and the second division FETs in the column area of an even column are formed so that an arrangement pattern of the division FETs becomes a second arrangement pattern different from the first arrangement pattern.

Here, the first arrangement pattern and the second arrangement pattern are determined so that the first number num11 to the fourth number num4 are equal (if possible).

Further, currently, for a stack type image sensor, FET#A and FET#B constituting the differential pair of the column parallel AD conversion unit 22 are each divided into 10 or more first division FETs and 10 or more second division FETs, the numbers of which are equal.

Further, for the 10 or more first division FETs and the 10 or more second division FETs, there are a large number of combinations as combinations of the first arrangement pattern and the second arrangement pattern in which the first number num11 to the fourth number num4 are equal (if possible).

For example, the combination that provides the most excellent crosstalk characteristic of the column parallel AD conversion unit 22 may be adopted from among such combinations of the first arrangement pattern and the second arrangement pattern.

Further, technology for reversing polarities of connections on an input side of a comparator constituting a reference signal comparison-type ADC of a column parallel AD conversion unit every other column is disclosed in Japanese Patent No. 4640507.

According to the technology disclosed in Japanese Patent No 4640507, for example, for a comparator in an even column, a reference signal s1 is input to an inversion input terminal (−) and an electrical signal s2 output by a pixel is input to a non-inversion input terminal (+), and for a comparator in an odd column, the electronic signal s2 output by the pixel is input to an inversion input terminal (−) and the reference signal s1 is input to a non-inversion input terminal (+), thereby preventing degradation of image quality due to lateral stripes called streaking from occurring in a uniform texture area of an image.

However, in the technology disclosed in Japanese Patent No. 4640507, it is difficult to improve a crosstalk of the column parallel AD conversion unit since first division FETs and second division FETs into which each of two FETs constituting a differential pair has been divided are not arranged in different arrangement patterns in two adjacent columns.

In other words, the present technology is completely different from the technology disclosed in a specification of Japanese Patent No. 4640507 in that, in the present technology, the first division FETs and the second division FETs into which two of FET#A$_n$ and FET#B$_n$ constituting the differential pair have been divided are arranged in different arrangement patterns in two adjacent columns, whereas in the technology disclosed in the specification of Japanese Patent No. 4640507, the polarities of connections on the input side of the comparator of the column parallel AD conversion unit are reversed every other column.

Further, since the technology disclosed in the specification of Japanese Patent No. 4640507 is not technology affecting the present technology, it may be used together with the present technology.

It should be understood by those skilled in the art that various modifications, combinations, sub-combinations and alterations may occur depending on design requirements and other factors insofar as they are within the scope of the appended claims or the equivalents thereof.

In other words, the present technology may be applied to a solid-state imaging device having an image sensor that receives radiation or other electromagnetic waves and outputs a corresponding electrical signal, as well as to the image sensor 2 that is a solid-state imaging device that captures an image.

Further, in the present embodiment, in the column parallel AD conversion unit 22, one ADC 31$_n$ is provided for one column of the pixel 11$_{m,n}$ of the pixel array 10. However, in the column parallel AD conversion unit 22, for example, one ADC may be provided for a plurality of columns such as two columns of the pixel 11$_{m,n}$ of the pixel array 10 and may AD-convert an electrical signal from the two columns of the pixel 11$_{m,n}$ in time division.

Further, in the present technology, in the adjacent (n−1)$^{th}$ and n$^{th}$ columns, the first division FETs and the second division FETs in the (n−1)$^{th}$ column and the first division FETs and the second division FETs in the n$^{th}$ column are necessarily arranged in different arrangement patterns, and the arrangement patterns of the first division FETs and the second division FETs in each set of two columns of every one column, such as a set of (n−1)$^{th}$ column and (n+1)$^{th}$ column and a set of n$^{th}$ column and (n+2)$^{th}$ column, may be the same and may be different.

Additionally, the present technology may also be configured as below.

[1]
A solid-state imaging device including:
an imaging unit including a plurality of image sensors; and
an analog to digital (AD) conversion unit including a plurality of AD converters arranged in a row direction, each AD converter performing AD conversion of an electrical signal output by the image sensor,
wherein each of the AD converters includes a comparator having a differential pair at an input stage, the differential pair including a first transistor and a second transistor,
wherein the first and second transistors are each divided into an equal number of a plurality of division transistors, and
wherein an arrangement pattern of the plurality of division transistors constituting the comparator in a predetermined column and an arrangement pattern of the plurality of division transistors constituting the comparator in an adjacent column adjacent to the predetermined column are different from each other.

[2]
The solid-state imaging device according to [1],
wherein the AD converter performs the AD conversion of the electrical signal by comparing, in the comparator, a predetermined reference signal with the electrical signal output by the image sensor.

[3]
The solid-state imaging device according to [2],
wherein the reference signal is a signal whose level is changed over time, and
wherein the AD converter further includes a counter that counts a time necessary for a change of the level of the reference signal until levels of the reference signal and the electrical signal output by the image sensor match.

[4]
The solid-state imaging device according to any one of [1] to [3],
wherein the first and second transistors are each divided into an even number of division transistors.

[5]
The solid-state imaging device according to any one of [1] to [4],
wherein the first division transistors and the second division transistors are arranged in each of the predetermined column and the adjacent column so that parasitic capacitance coupling between the first transistor in the predetermined column and each of the first transistor and the second transistor in the adjacent column is created, and parasitic capacitance coupling between the second transistor in the predetermined column and each of the first transistor and the second transistor in the adjacent column is created.

[6]
The solid-state imaging device according to any one of [1] to [4],
wherein, in each of the predetermined column and the adjacent column, the first division transistors and the second division transistors are arranged so that the number of the first division transistors into which the first transistor in the predetermined column has been divided and the first division transistors in the adjacent column that face each other, the number of the second division transistors into which the second transistor in the predetermined column has been divided and the second division transistors in the adjacent column that face each other, the number of the first division transistors in the predetermined column and the second division transistors in the adjacent column that face each other, and the number of the second division transistors in the predetermined column and the first division transistors in the adjacent column that face each other are all equal.

[7]
The solid-state imaging device according to any one of [1] to [6],
wherein the solid-state imaging device includes two bare chips stacked vertically,
wherein the imaging unit is included in an upper chip stacked on an upper side of the two bare chips, and
wherein the AD conversion unit is included in an lower chip stacked on a lower side of the two bare chips.

[8]
A method of manufacturing a solid-state imaging device including an imaging unit including a plurality of image sensors, and an analog to digital (AD) conversion unit including a plurality of AD converters arranged in a row direction, each AD converter performing AD conversion of an electrical signal output by the image sensor, the method including:
including, in each of the AD converters, a comparator having a differential pair at an input stage, the differential pair including a first transistor and a second transistor;
dividing the first and second transistors each into an equal number of a plurality of division transistors; and
arranging the plurality of division transistors constituting the comparator in a predetermined column and the plurality of division transistors constituting the comparator in an adjacent column adjacent to the predetermined column in different arrangement patterns.

What is claimed is:
1. An imaging device comprising:
a plurality of pixels arranged in rows and columns, the plurality of pixels including:
a first pixel disposed in an nth column, wherein the first pixel outputs a first signal; and
a second pixel disposed in an n+2 column, wherein the second pixel outputs a second signal;
a first comparator coupled to the first pixel, the first comparator including:
a first transistor that receives the first signal; and
a second transistor that receives a reference signal;
a second comparator coupled to the second pixel, the second comparator including:
a third transistor that receives the second signal; and
a fourth transistor that receives the reference signal;
a first substrate including the plurality of pixels; and
a second substrate including the first comparator and the second comparator, wherein the first substrate is bonded to the second substrate,
wherein the first transistor, the second transistor, the third transistor and the fourth transistor are divided into an equal number of a plurality of division transistors, and an order of an arrangement of the plurality of division transistors constituting the first transistor and the second transistor is the same as an order of an arrangement of the plurality of division transistors constituting the third transistor and the fourth transistor.

2. The imaging device according to claim 1, further comprising:
a third pixel disposed in an n−1 column, wherein the third pixel outputs a third signal; and
a third comparator coupled to the third pixel, the third comparator including:
a fifth transistor that receives the third signal; and
a sixth transistor that receives the reference signal,
wherein the fifth transistor and the sixth transistor are divided into the equal number of a plurality of division transistors, and an order of an arrangement of the plurality of division transistors constituting the fifth transistor and the sixth transistor is different from the order of the arrangement of the plurality of division transistors constituting the first transistor and the second transistor.

3. The imaging device according to claim 2, further comprising:
a fourth pixel disposed in an n+1 column, wherein the fourth pixel outputs a fourth signal; and
a fourth comparator coupled to the fourth pixel, the fourth comparator including;
a seventh transistor that receives the fourth signal; and
an eighth transistor that receives the reference signal,
wherein the seventh transistor and the eighth transistor are divided into the equal number of a plurality of division transistors, and an order of an arrangement of the plurality of division transistors constituting the seventh transistor and the eighth transistor is different from the order of the arrangement of the plurality of division transistors constituting the third transistor and the fourth transistor.

4. The imaging device according to claim 3, wherein the order of the arrangement of the plurality of division transistors constituting the fifth transistor and the sixth transistor is the same as the order of the arrangement of the plurality of division transistors constituting the seventh transistor and the eighth transistor.

5. The imaging device according to claim 2, wherein a gate of the third transistor receives the second signal and a gate of the fourth transistor receives the reference signal.

6. The imaging device according to claim 5, further comprising:
a third pixel disposed in an n−1 column, wherein the third pixel outputs a third signal; and
a third comparator coupled to the third pixel, the third comparator including:
a fifth transistor that receives the third signal; and
a sixth transistor that receives the reference signal,
wherein the fifth transistor and the sixth transistor are divided into the equal number of a plurality if division transistors, and an order of an arrangement of the plurality of division transistors constituting the fifth transistor and the sixth transistor is different from the order of the arrangement of the plurality of division transistors constituting the first transistor and the second transistor, and
wherein a gate of the fifth transistor receives the third signal and a gate of the sixth transistor receives the reference signal.

7. The imaging device according to claim 6, further comprising:
a fourth pixel disposed in an n+1 column, wherein the fourth pixel outputs a fourth signal; and
a fourth comparator coupled to the fourth pixel, the fourth comparator including;
a seventh transistor that receives the fourth signal; and
an eighth transistor that receives the reference signal,
wherein the seventh transistor and the eighth transistor are divided into the equal number of a plurality of division transistors, and an order of an arrangement of the plurality of division transistors constituting the seventh transistor and the eighth transistor is different from the order of the arrangement of the plurality of division transistors constituting the third transistor and the fourth transistor, and
wherein a gate of the seventh transistor receives the fourth signal and a gate of the eighth transistor receives the reference signal.

8. The imaging device according to claim 1, wherein a gate of the first transistor receives the first signal and a gate of the second transistor receives the reference signal.

9. An electronic apparatus comprising:
an optical system;
an imaging device, wherein light from the optical system is received by the imaging device, and wherein the imaging device includes:
a plurality of pixels arranged in rows and columns, the plurality of pixels including:
a first pixel disposed in an nth column, wherein the first pixel outputs a first signal; and
a second pixel disposed in an n+2 column, wherein the second pixel outputs a second signal;
a first comparator coupled to the first pixel, the first comparator including:
a first transistor that receives the first signal; and
a second transistor that receives a reference signal;
a second comparator coupled to the second pixel, the second comparator including;
a third transistor that receives the second signal; and
a fourth transistor that receives the reference signal;
a first substrate including the plurality of pixels; and
a second substrate including the first comparator and the second comparator, wherein the first substrate is bonded to the second substrate,
wherein the first transistor, the second transistor, the third transistor and the fourth transistor are divided into an equal number of a plurality of division transistors, and an order of an arrangement of the plurality of division transistors constituting the first transistor and the second transistor is the same as an order of an arrangement of the plurality of division transistors constituting the third transistor and the fourth transistor;
a memory, wherein image data output by the imaging device is stored;
a signal processing unit, wherein the signal processing unit performs a process using the image data stored in the memory; and
an output unit, wherein the output units processed image data from the signal processing unit.

10. The electronic apparatus according to claim 9, further comprising:
a third pixel disposed in an n−1 column, wherein the third pixel outputs a third signal; and a third comparator coupled to the third pixel, the third
comparator including:
a fifth transistor that receives the third signal; and
a sixth transistor that receives the reference signal,
wherein the fifth transistor and the sixth transistor are
divided into the equal number of a plurality of division
transistors, and an order of an arrangement of the
plurality of division transistors constituting the fifth
transistor and the sixth transistor is different from the
order of the arrangement of the plurality of division
transistors constituting the first transistor and the second transistor.

11. The electronic apparatus according to claim 10, further comprising:
a fourth pixel disposed in an n+1 column, wherein the fourth pixel outputs a fourth signal; and
a fourth comparator coupled to the fourth pixel, the fourth comparator including:
a seventh transistor that receives the fourth signal; and
an eighth transistor that receives the reference signal,
wherein the seventh transistor and the eighth transistor are
divided into the equal number of a plurality of division
transistors, and an order of an arrangement of the
plurality of division transistors constituting the seventh
transistor and the eighth transistor is different from the
order of the arrangement of the plurality of division
transistors constituting the third transistor and the
fourth transistor.

12. The electronic apparatus according to claim 11, wherein the order of the arrangement of the plurality of division transistors constituting the fifth transistor and the sixth transistor is the same as the order of the arrangement of the plurality of division transistors constituting the seventh transistor and the eighth transistor.

13. The electronic apparatus according to claim 10, wherein a gate of the third transistor receives the second signal and a gate of the fourth transistor receives the reference signal.

14. The electronic apparatus according to claim 13, further comprising:
a third pixel disposed in an n−1 column, wherein the third pixel outputs a third signal; and
a third comparator coupled to the third pixel, the third comparator including:
a fifth transistor that receives the third signal; and
a sixth transistor that receives the reference signal,
wherein the fifth transistor and the sixth transistor are
divided into the equal number of a plurality if division
transistors, and an order of an arrangement of the
plurality of division transistors constituting the fifth
transistor and the sixth transistor is different from the
order of the arrangement of the plurality of division
transistors constituting the first transistor and the second transistor, and
wherein a gate of the fifth transistor receives the third signal and a gate of the sixth transistor receives the reference signal.

15. The electronic apparatus according to claim 14, further comprising;
a fourth pixel disposed in an n+1 column, wherein the fourth pixel outputs a fourth signal; and
a fourth comparator coupled to the fourth pixel, the fourth comparator including;
a seventh transistor that receives the fourth signal; and
an eighth transistor that receives the reference signal,
wherein the seventh transistor and the eighth transistor are
divided into the equal number of a plurality of division
transistors, and an order of an arrangement of the
plurality of division transistors constituting the seventh
transistor and the eighth transistor is different from the
order of the arrangement of the plurality of division
transistors constituting the third transistor and the
fourth transistor, and
wherein a gate of the seventh transistor receives the fourth signal and a gate of the eighth transistor receives the reference signal.

16. The electronic apparatus according to claim 9, wherein a gate of the first transistor receives the first signal and a gate of the second transistor receives the reference signal.

17. An imaging device comprising:
a plurality of pixels arranged in rows and columns, the plurality of pixels including:
a first pixel disposed in an nth column, wherein the first pixel outputs a first signal;
a second pixel disposed in an n+2 column, wherein the second pixel outputs a second signal; and
a third pixel disposed in an n−1 column, wherein the third pixel outputs a third signal;
a first comparator coupled to the first pixel, the first comparator including:
a first transistor that receives the first signal; and
a second transistor that receives a reference signal;
a second comparator coupled to the second pixel, the second comparator including:
a third transistor that receives the second signal; and
a fourth transistor that receives the reference signal; and
a third comparator coupled to the third pixel, the third comparator including:
a fifth transistor that receives the third signal; and
a sixth transistor that receives the reference signal,
wherein the first transistor, the second transistor, the third
transistor and the fourth transistor are divided into an
equal number of a plurality of division transistors, and
an order of an arrangement of the plurality of division
transistors constituting the first transistor and the second transistor is the same as an order of an arrangement
of the plurality of division transistors constituting the
third transistor and the fourth transistor, wherein the
fifth transistor and the sixth transistor are divided into
the equal number of a plurality of division transistors,
and an order of an arrangement of the plurality of
division transistors constituting the fifth transistor and
the sixth transistor is different from the order of the
arrangement of the plurality of division transistors
constituting the first transistor and the second transistor.

18. The imaging device according to claim 17, further comprising:
a fourth pixel disposed in an n+1 column, wherein the fourth pixel outputs a fourth signal; and
a fourth comparator coupled to the fourth pixel, the fourth comparator including;
a seventh transistor that receives the fourth signal; and
an eighth transistor that receives the reference signal,
wherein the seventh transistor and the eighth transistor are
divided into the equal number of a plurality of division
transistors, and an order of an arrangement of the
plurality of division transistors constituting the seventh
transistor and the eighth transistor is different from the
order of the arrangement of the plurality of division
transistors constituting the third transistor and the
fourth transistor.

19. The imaging device according to claim 18, wherein the order of the arrangement of the plurality of division transistors constituting the fifth transistor and the sixth transistor is the same as the order of the arrangement of the plurality of division transistors constituting the seventh transistor and the eighth transistor.

20. The imaging device according to claim 17, wherein a gate of the third transistor receives the second signal and a gate of the fourth transistor receives the reference signal.

* * * * *